US012712539B2

(12) United States Patent
Suzuki et al.

(10) Patent No.: US 12,712,539 B2
(45) Date of Patent: Aug. 18, 2026

(54) RADIO-FREQUENCY CIRCUIT

(71) Applicant: Murata Manufacturing Co., Ltd., Kyoto (JP)

(72) Inventors: Yuusuke Suzuki, Kyoto (JP); Masateru Higashi, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 7 days.

(21) Appl. No.: 19/085,206

(22) Filed: Mar. 20, 2025

(65) Prior Publication Data

US 2025/0309876 A1 Oct. 2, 2025

(30) Foreign Application Priority Data

Mar. 27, 2024 (JP) ................................ 2024-052242

(51) Int. Cl.
*H03K 5/1252* (2006.01)
*H03K 17/56* (2006.01)

(52) U.S. Cl.
CPC ........... *H03K 5/1252* (2013.01); *H03K 17/56* (2013.01)

(58) Field of Classification Search
CPC ........ H03K 5/1252; H03K 17/56; H04B 1/40; H03H 11/04; H03H 11/28; H03H 7/0153; H03H 11/0472; H03H 11/1291; H03H 2210/00; H03H 2210/01
See application file for complete search history.

(56) References Cited

U.S. PATENT DOCUMENTS

2020/0358516 A1 11/2020 Wloczysiak
2022/0263535 A1 * 8/2022 Tani ........................ H04B 1/00

* cited by examiner

*Primary Examiner* — Jung Kim
(74) *Attorney, Agent, or Firm* — McDonald Hopkins LLC

(57) ABSTRACT

A radio-frequency circuit includes: a switch circuit having a common terminal and terminals; a signal path P1 connected to the terminal and transmitting a signal in band A; a signal path P2 connected to the terminal and transmitting a signal in band B; a filter arranged in the signal path P2; a signal path P3 connected to the terminal and transmitting a signal in band D, which can be transmitted simultaneously with band A and can be transmitted simultaneously with band B; a capacitor arranged in series in the signal path P2 between the terminal and the filter; an inductor connected between the signal path P2 between the capacitor and the filter and ground; and a switch circuit 300 having terminals, the terminal connected to the signal path P2 between the capacitor and the filter, and the terminal connected to the signal path P3.

10 Claims, 7 Drawing Sheets

SIMULTANEOUS RECEPTION IN BANDS B/C/D

SIMULTANEOUS RECEPTION IN BANDS A/D

SIMULTANEOUS RECEPTION IN BANDS A/B/C

SIMULTANEOUS RECEPTION IN BANDS A/B/C/D

RECEPTION IN BAND D

RADIO-FREQUENCY CIRCUIT

CROSS REFERENCE TO RELATED APPLICATION

This application claims priority from Japanese Patent Application No. 2024-052242 filed on Mar. 27, 2024. The content of this application is incorporated herein by reference in its entirety.

BACKGROUND ART

The present disclosure relates to a radio-frequency (RF) circuit.

U.S. Patent Application Publication No. 2020/0358516 (FIG. 9) discloses a front-end circuit including a switch and filters respectively connected to the terminals of the switch. The front-end circuit is configured to be capable of simultaneously transmitting signals in different bands (CA: Carrier Aggregation).

In the front-end circuit (RF circuit) disclosed in U.S. Patent Application Publication No. 2020/0358516, for example, in the case of simultaneously transmitting a signal in band B7 (band A) and a signal in band B1/B3 (band B), an impedance matching circuit including a capacitor element arranged in series may be arranged between the filter for band B1/B3 and the switch in order to optimize the impedance in the range of band B1/B3.

BRIEF SUMMARY

However, when the above-mentioned impedance matching circuit is arranged, for example, in the case of simultaneously transmitting a signal in band B1/B3 and a signal in band B32 (band C), an optional attenuation pole is formed in the passband of band B32, resulting in an increase in the transmission loss of the signal in band B32.

The present disclosure provides a radio-frequency circuit capable of simultaneously transmitting signals in multiple bands with low loss.

A radio-frequency circuit according to an aspect of the present disclosure includes: a first switch circuit having a first common terminal, a first terminal, a second terminal, and a third terminal; a first signal path connected to the first terminal; a first filter arranged in the first signal path and having a passband containing a reception band of a first band; a second signal path connected to the second terminal; a second filter arranged in the second signal path and having a passband containing a reception band of a second band; a third signal path connected to the third terminal and transmitting a reception signal in a third band that can be transmitted simultaneously with the first band and can be transmitted simultaneously with the second band; a first capacitor arranged in series in the second signal path between the second terminal and the second filter; a first inductor connected between the second signal path between the first capacitor and the second filter and ground; and a second switch circuit having a fourth terminal and a fifth terminal, the fourth terminal connected to the second signal path between the first capacitor and the second filter, and the fifth terminal connected to the third signal path.

According to the present disclosure, it is possible to provide a radio-frequency circuit capable of simultaneously transmitting signals in multiple bands with low loss.

DETAILED DESCRIPTION

Figure 1:
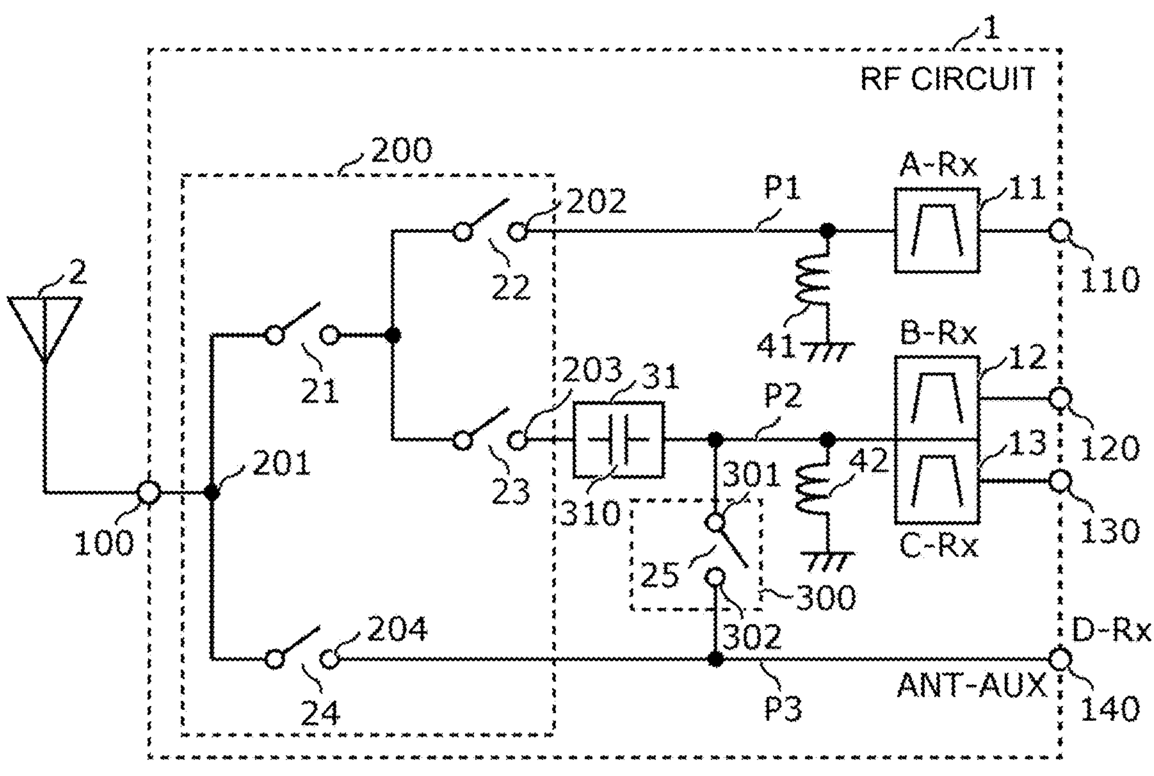
FIG. 1 is a circuit configuration diagram of a radio-frequency (RF) circuit according to an embodiment.

Hereinafter, an embodiment of the present disclosure will be described in detail using the drawings. Note that the embodiment described hereinafter is all illustrative of comprehensive or specific examples. The numerical values, shapes, materials, components, and component arrangement and connection forms discussed in the following embodiment are merely examples and are not intended to limit the present disclosure. Any components in the following embodiment that are not described in the independent claims are explained as optional components. Additionally, the sizes or size ratios of components illustrated in the drawings are not necessarily depicted with strict accuracy.

Note that each of the drawings is a schematic diagram that has been appropriately emphasized, omitted, or adjusted in scale to illustrate the present disclosure. Therefore, the drawings are not necessarily depicted with strict accuracy and may differ from the actual shapes, positional relationships, and proportions. In each of the drawings, the same reference numerals are assigned to substantially identical configurations, and overlapping descriptions may be omitted or simplified.

In the circuit configuration of the present disclosure, "connected" refers not only to direct connections by connection terminals and/or wiring conductors but also to electrical connections with matching elements or switch circuits interposed therebetween. "Connected between A and B" means connected to both A and B between A and B.

In the present disclosure, "terminal" refers to the point at which a conductor within an element ends. Note that, if the impedance of a conductor between elements is sufficiently low, a terminal is interpreted not only as a single point but also as any point (node) on the conductor between the elements or as the entire conductor.

Furthermore, in the present disclosure, "signal path" refers to a transmission line composed of wiring through which a radio-frequency (RF) transmission signal or an RF reception signal propagates, an electrode directly connected to the wiring, and a terminal directly connected to the wiring or the electrode.

Additionally, in the circuit element arrangement of the present disclosure, "component A is arranged in series in path B" means that both the signal input end and the signal output end of component A are connected to two respective wirings that constitute at least part of path B. Note that at least one of the two wirings may be an electrode or a terminal.

In addition, in the following embodiment, the passband of a filter is defined as a frequency band between two frequencies that are 3 dB greater than the minimum value of an insertion loss in the passband.

Furthermore, in the present disclosure, "band" refers to at least one of the uplink operating band and the downlink operating band of a frequency band predefined by a standardization organization (such as 3GPP (registered trademark), IEEE (Institute of Electrical and Electronics Engineers), etc.) for communication systems built using radio access technology (RAT). In the present embodiment, the communication systems can be, for example, LTE (Long Term Evolution) systems, 5G (5th Generation)-NR (New Radio) systems, WLAN (Wireless Local Area Network) systems, and the like, but are not limited to these. Note that the uplink operating band of a frequency band refers to the frequency range specified for the uplink of the frequency band. Additionally, the downlink operating band of a frequency band refers to the frequency range specified for the downlink of the frequency band.

Embodiment

1 Circuit Configuration of Radio-Frequency Circuit 1

The circuit configuration of a radio-frequency (RF) circuit 1 according to the present embodiment will be described with reference to FIG. 1. FIG. 1 is a circuit configuration diagram of the RF circuit 1 according to the embodiment. As illustrated in the diagram, the RF circuit 1 according to the present embodiment includes filters 11, 12, and 13, switches 21, 22, 23, 24, and 25, signal paths P1, P2, and P3, a matching circuit 31, inductors 41 and 42, an antenna connection terminal 100, and RF output terminals 110, 120, 130, and 140.

The antenna connection terminal 100 is connected to an antenna 2 and to a switch circuit 200 of the RF circuit 1. The RF output terminal 110 is an external connection terminal connected to the signal path P1 and the filter 11. The RF output terminal 120 is an external connection terminal connected to the signal path P2 and the filter 12. The RF output terminal 130 is an external connection terminal connected to the signal path P2 and the filter 13. The RF output terminal 140 is an external connection auxiliary terminal connected to the signal path P3. Note that the antenna connection terminal 100 and the RF output terminals 110 to 140 need not be included in the RF circuit 1.

The switches 21, 22, 23 and 24 constitute the switch circuit 200. The switch circuit 200, which is an example of a first switch circuit, has a common terminal 201 (first common terminal), and terminals 202 (first terminal), 203 (second terminal), and 204 (third terminal). One of two ends of the switch 21 and one of two ends of the switch 24 are the common terminal 201; the other end of the switch 21 is connected to one of two ends of the switch 22 and one of two ends of the switch 23; the other end of the switch 22 is the terminal 202; the other end of the switch 23 is the terminal 203; and the other end of the switch 24 is the terminal 204. With the above-mentioned connection configuration, the switch circuit 200 can switch between the connection and disconnection between the common terminal 201 and the terminal 202, can switch between the connection and disconnection between the common terminal 201 and the terminal 203, and can switch between the connection and disconnection between the common terminal 201 and the terminal 204.

The switch circuit 200 according to the present embodiment is constituted of the four SPST (Single-Pole Single-Throw)-type switches 21 to 24; however, the switch circuit 200 may be constituted of one SP3T (Single-Pole 3-Throw)-type switch.

The signal path P1 is an example of a first signal path, with one of its ends connected to the terminal 202 and the other end connected to the RF output terminal 110. The signal path P1 can transmit the reception signal in band A (first band).

The signal path P2 is an example of a second signal path, with one of its ends connected to the terminal 203 and the other end connected to the RF output terminals 120 and 130. The signal path P2 can transmit the reception signal in band B (second band) and the reception signal in band C.

The signal path P3 is an example of a third signal path, with one of its ends connected to the terminal 204 and the other end connected to the RF output terminal 140. The signal path P3 can transmit the reception signal in band D (third band). Band D includes, for example, the 1.5-GHz band. The signal path P3 is provided with no filter; the configuration of an external circuit (such as a filter) connected to the RF output terminal 140 makes it possible to transmit signals in frequency ranges other than band D. Note that the signal path P3 may be provided with a filter having a passband containing the reception band of band D.

Note that band A is a band that can be transmitted simultaneously with band D, while band B and band C are bands that can be transmitted simultaneously with band D.

The filter 11, which is an example of a first filter, is arranged in the signal path P1 and has a passband containing the reception band of band A. One of two ends of the filter 11 is connected to the terminal 202, and the other end is connected to the RF output terminal 110.

The filter 12, which is an example of a second filter, is arranged in the signal path P2 and has a passband containing the reception band of band B. One of two ends of the filter 12 is connected to the matching circuit 31, and the other end is connected to the RF output terminal 120. The filter 13 is arranged in the signal path P2, and has a passband containing the reception band of band C. One of two ends of the filter 13 is connected to the matching circuit 31, and the other end is connected to the RF output terminal 130. Note that the filter 13 need not be included in the RF circuit 1.

The matching circuit 31 is connected between the terminal 203 and the filters 12 and 13. The matching circuit 31 at least includes a capacitor 310. The capacitor 310, which is an example of a first capacitor, is arranged in series in the signal path P2 between the terminal 203 and the filter 12. Note that the matching circuit 31 may include at least one of an inductor and a capacitor in addition to the capacitor 310.

The inductor 42, which is an example of a first inductor, is connected between the signal path P2 between the capacitor 310 and the filter 12 and ground. The inductor 41 is connected between the signal path P1 between the terminal 202 and the filter 11 and ground. Note that the inductor 41 need not be included in the RF circuit 1.

The switch 25 constitutes a switch circuit 300. The switch circuit 300, which is an example of a second switch circuit, has terminals 301 (fourth terminal) and 302 (fifth terminal). One of two ends of the switch 25 is the terminal 301, and the other end of the switch 25 is the terminal 302. The switch circuit 300 can switch between the connection and disconnection between the terminal 301 and the terminal 302. The terminal 301 is connected to the signal path P2 between the capacitor 310 and the filter 12, and the terminal 302 is connected to the signal path P3. In the present embodiment, the terminal 301 is connected to the signal path P2 between the capacitor 310 and the inductor 42; however, the terminal 301 may be connected to the signal path P2 between the inductor 42 and the filters 12 and 13.

The switch circuit 300 according to the present embodiment is constituted of one SPST-type switch 25; however, the switch circuit 300 may be constituted of multiple SPST-type switches that are connected in series.

In the present embodiment, band A is, for example, band B7, B39, B40, or B41 for LTE, or band n7, n39, n40, or n41 for 5G-NR. Additionally, band B is, for example, band B1 or B3 for LTE, or band n1 or n3 for 5G-NR. Furthermore, band C is, for example, band B1 or B3 for LTE, or band n1 or n3 for 5G-NR. Also, band D is, for example, band B32, B75, or B76 for LTE, or band n32, n75, or n76 for 5G-NR.

2 RF Circuit 500 According to First Comparative Example

Figure 2A:
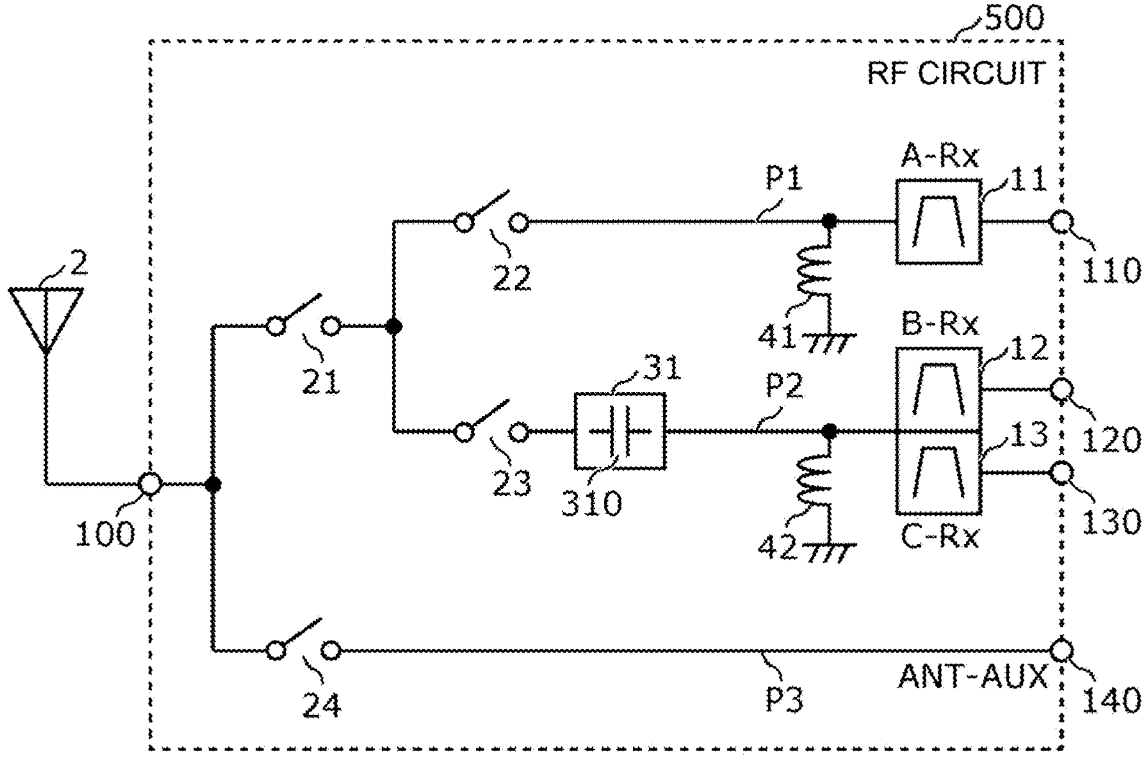
FIG. 2A is a circuit configuration diagram of an RF circuit according to a first comparative example.

Next, the circuit configuration of an RF circuit 500 according to a first comparative example will be described with reference to FIG. 2A. FIG. 2A is a circuit configuration diagram of the RF circuit 500 according to the first comparative example. As illustrated in the diagram, the RF circuit 500 includes the filters 11, 12 and 13, switches 21, 22, 23 and 24, signal paths P1, P2 and P3, matching circuit 31, inductors 41 and 42, antenna connection terminal 100, and RF terminals 110, 120, 130 and 140. The RF circuit 500 according to the first comparative example differs from the RF circuit 1 according to the embodiment only in the point that the switch 25 is not arranged.

In the RF circuit 500, in the case of simultaneously transmitting the reception signal in band A and the reception signal in band D, the switches 21, 22, and 24 are in a conducting state, and the switch 23 is in a non-conducting state. This allows the reception signal in band A to be transmitted through the signal path P1 and the reception signal in band D to be transmitted through the signal path P3, enabling low-loss transmission of the reception signal in band A and the reception signal in band D.

In contrast, in the case of simultaneously transmitting the reception signals in bands B and C and the reception signal in band D, the switches 21, 23, and 24 are in a conducting state, and the switch 22 is in a non-conducting state. This allows the reception signals in bands B and C to be transmitted through the signal path P2, and the reception signal in band D to be transmitted through the signal path P3. At this time, with the signal paths P2 and P3 commonly connected to the antenna connection terminal 100, the matching circuit 31 matches the impedance in the range of bands B and C when viewing the signal path P2 from the antenna connection terminal 100 to a reference impedance. However, due to the LC circuit constituted of the capacitor 310 and the inductor 42, an attenuation pole is formed in the band D range of the bandpass characteristic of the signal path P2. As a result, the bandpass characteristic of the signal path P2 affects the bandpass characteristic of the signal path P3 connected to the antenna connection terminal 100, leading to a degradation in the insertion loss in the band D range.

In the RF circuit 500 according to the first comparative example, in both the case of simultaneously receiving band D and another band, and in the case of receiving band D alone, the path for transmitting the reception signal in band D is restricted to the path that passes through the switch 24.

3 RF Circuit 600 According to Second Comparative Example

Figure 2B:
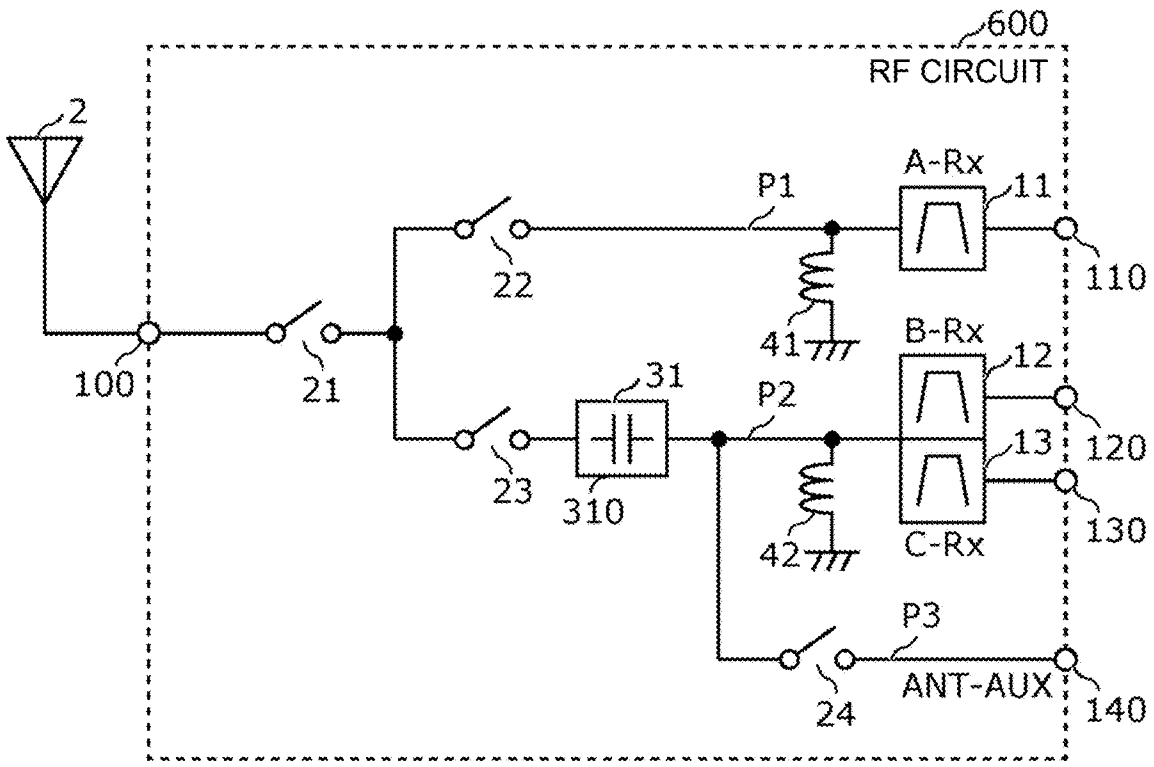
FIG. 2B is a circuit configuration diagram of an RF circuit according to a second comparative example.

Next, the circuit configuration of an RF circuit 600 according to a second comparative example will be described with reference to FIG. 2B. FIG. 2B is a circuit configuration diagram of the RF circuit 600 according to the second comparative example. As illustrated in the diagram, the RF circuit 600 includes the filters 11, 12 and 13, switches 21, 22, 23 and 24, signal paths P1, P2 and P3, matching circuit 31, inductors 41 and 42, antenna connection terminal 100, and RF terminals 110, 120, 130 and 140. The RF circuit 600 according to the second comparative example differs from the RF circuit 1 according to the embodiment in the point that the switch 25 is not arranged, and in the connection configuration of the switch 24.

The switch 24 is connected between the signal path P2 between the matching circuit 31 and the filter 12 and the RF output terminal 140.

In the RF circuit 600, in the case of simultaneously transmitting the reception signals in bands B and C and the reception signal in band D, the switches 21, 23, and 24 are in a conducting state, and the switch 22 is in a non-conducting state. This allows the reception signals in bands B and C to be transmitted through the signal path P2, and the reception signal in band D to be transmitted through the signal path P3. At this time, with the signal paths P2 and P3 commonly connected to the antenna connection terminal 100 with the matching circuit 31 interposed therebetween, the matching circuit 31 matches the impedance in the range of bands B and C when viewing the signal path P2 from the antenna connection terminal 100 to the reference impedance. Since the signal path P3 is connected to the connection point between the capacitor 310 and the inductor 42, the attenuation pole in the band D range formed by the LC circuit constituted of the capacitor 310 and the inductor 42 does not affect the signal path P3. This enables low-loss transmission of the reception signals in bands B and C and the reception signal in band D.

In contrast, in the case of simultaneously transmitting the reception signal in band A and the reception signal in band D, the switches 21, 22, 23, and 24 are in a conducting state. This allows the reception signal in band A to be transmitted through the signal path P1, and the reception signal in band D to be transmitted through the matching circuit 31 and the signal path P3. At this time, since the reception signal in band D passes through the matching circuit 31 for adjusting the impedance in the range of bands B and C, the insertion loss in the band D range of the bandpass characteristics of the signal path P3 is degraded.

In the RF circuit 600 according to the second comparative example, in both the case of simultaneously receiving band D and another band, and in the case of receiving band D alone, the path for transmitting the reception signal in band D is restricted to the path that passes through the switch 23, the matching circuit 31, and the switch 24.

4 Circuit State in Each Signal Reception Mode of RF Circuit

Next, the circuit state in each signal reception mode of the RF circuit 1 according to the present embodiment will be described.

Figure 3A:
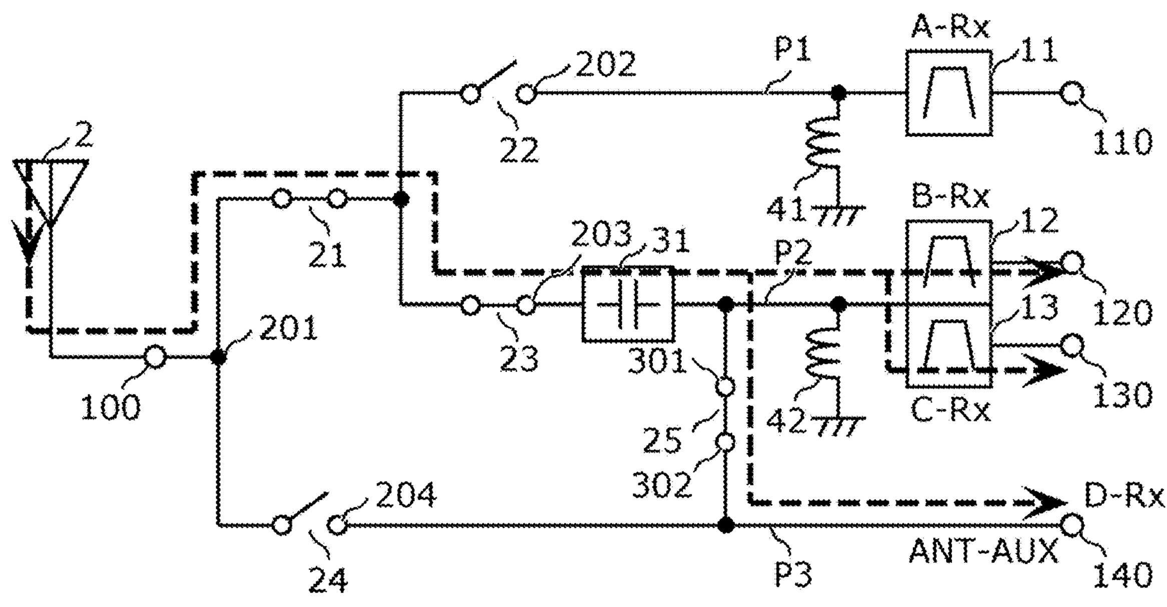
FIG. 3A is a circuit state diagram illustrating a first signal reception mode of the RF circuit according to the embodiment.

FIG. 3A is a circuit state diagram illustrating a first signal reception mode of the RF circuit 1 according to the embodiment. The first signal reception mode is a mode for simultaneously receiving the reception signal in band B (second band), the reception signal in band C, and the reception signal in band D (third band) (simultaneous reception in bands B/C/D). In the case of the first signal reception mode, as illustrated in FIG. 3A, the switches 21, 23, and 25 are in a conducting state, and the switches 22 and 24 are in a non-conducting state. In other words, the common terminal 201 and the terminal 203 are connected, the common terminal 201 and the terminal 204 are disconnected, the common terminal 201 and the terminal 202 are disconnected, and the terminal 301 and the terminal 302 are connected.

This allows the reception signal in band B to pass through the antenna connection terminal 100, the switches 21 and 23, the matching circuit 31, and the filter 12, and reach the RF output terminal 120. Additionally, the reception signal in band C passes through the antenna connection terminal 100, the switches 21 and 23, the matching circuit 31, and the filter 13, and reaches the RF output terminal 130. Furthermore, the reception signal in band D passes through the antenna connection terminal 100, the switches 21 and 23, the matching circuit 31, and the switch 25, and reaches the RF output terminal 140.

In the first signal reception mode, the reception signal in band B and the reception signal in band C are transmitted through the signal path P2, and the reception signal in band D is transmitted through the signal path P3. At this time, with the signal paths P2 and P3 commonly connected to the terminal 203 with the matching circuit 31 interposed therebetween, the matching circuit 31 matches the impedance in the range of bands B and C when viewing the signal paths P2 from the terminal 203 to the reference impedance. Since the signal path P3 is connected to the connection point between the capacitor 310 and the inductor 42, the attenuation pole in the band D range formed by the LC circuit constituted of the capacitor 310 and the inductor 42 does not affect the signal path P3. This enables low-loss transmission of the reception signals in bands B, C, and D in the first signal reception mode.

Note that, in the case of transmitting signals in bands other than band D (hereinafter referred to as other band signals) through the signal path P3 in the first signal reception mode, that is, in the case where the attenuation pole in the band D range formed by the LC circuit constituted of the capacitor 310 and the inductor 42 is not included in the range of the other band signals, the switches 21, 23, and 24 may be in a conducting state, and the switch 25 may be in a non-conducting state. This allows the reception signal in band B to pass through the antenna connection terminal 100, the switches 21 and 23, the matching circuit 31, and the filter 12, and reach the RF output terminal 120. Additionally, the other band signals pass through the antenna connection terminal 100 and the switch 24, and reach the RF output terminal 140. This enables low-loss transmission of the reception signals in bands B and C as well as the other band signals in the first signal reception mode.

Figure 3B:
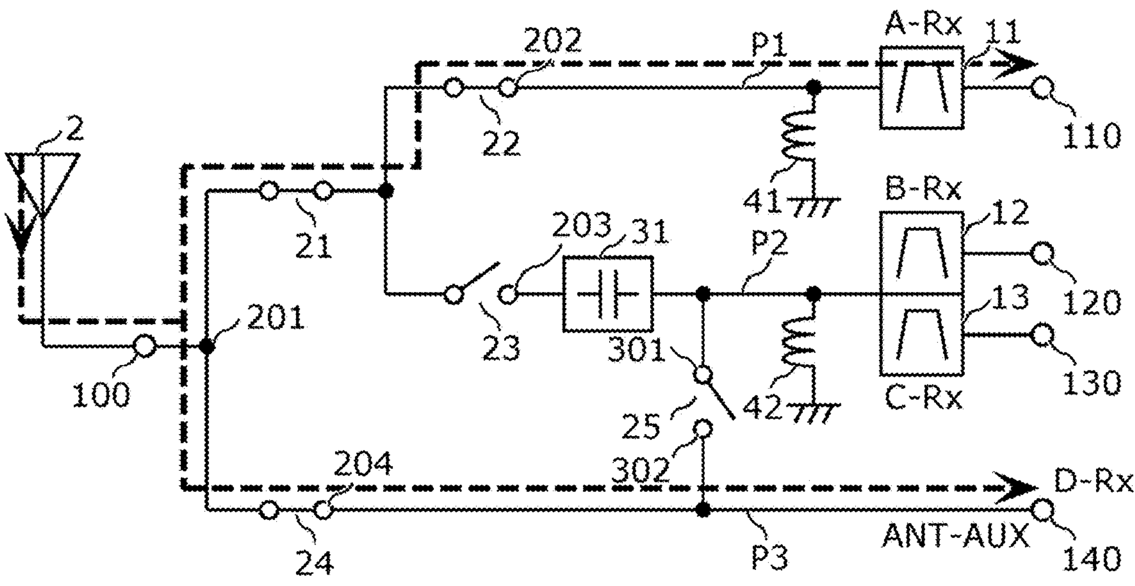
FIG. 3B is a circuit state diagram illustrating a second signal reception mode of the RF circuit according to the embodiment.

FIG. 3B is a circuit state diagram illustrating a second signal reception mode of the RF circuit 1 according to the embodiment. The second signal reception mode is a mode for simultaneously receiving the reception signals in band A (first band) and band D (third band) (simultaneous reception in bands A/D). In the case of the second signal reception mode, as illustrated in FIG. 3B, the switches 21, 22, and 24 are in a conducting state, and the switch 23 is in a non-conducting state. In other words, the common terminal 201 and the terminal 202 are connected, the common terminal 201 and the terminal 203 are disconnected, the common terminal 201 and the terminal 204 are connected, and the terminal 301 and the terminal 302 are disconnected.

This allows the reception signal in band A to pass through the antenna connection terminal 100, the switches 21 and 22, and the filter 11, and reach the RF output terminal 110. Additionally, the reception signal in band D passes through the antenna connection terminal 100 and the switch 24, and reaches the RF output terminal 140.

In the second signal reception mode, the reception signal in band A is transmitted through the signal path P1, and the reception signal in band D is transmitted through the signal path P3. At this time, the signal paths P1 and P3 are not connected to the matching circuit 31 for adjusting the impedance in the range of bands B and C, and the reception signal in band A and the reception signal in band D do not pass through the matching circuit 31; thus, the reception signal in band A and the reception signal in band D can be transmitted with low loss.

According to the RF circuit 1 according to the present embodiment, in the case of the first signal reception mode (simultaneous reception in bands B/C/D), the impedance in the range of the reception signals in band B and band C can be adjusted by the LC circuit constituted of the capacitor 310 and the inductor 42, and the use of the signal path P3 passing through the switch circuit 300 can prevent an attenuation pole in band D to be formed in the signal path P3 due to the above-mentioned LC circuit. Thus, the transmission loss of the reception signals in bands B, C, and D can be reduced. Additionally, in the case of the second signal reception mode (simultaneous reception in bands A/D), the use of the signal paths P1 and P3 passing through the switch circuit 200 and not passing through the switch circuit 300 can reduce the transmission loss of the reception signals in bands A and D. Thus, it is possible to provide the RF circuit 1, which is capable of simultaneously transmitting signals in multiple bands A, B, C, and D with low loss.

Figure 3C:
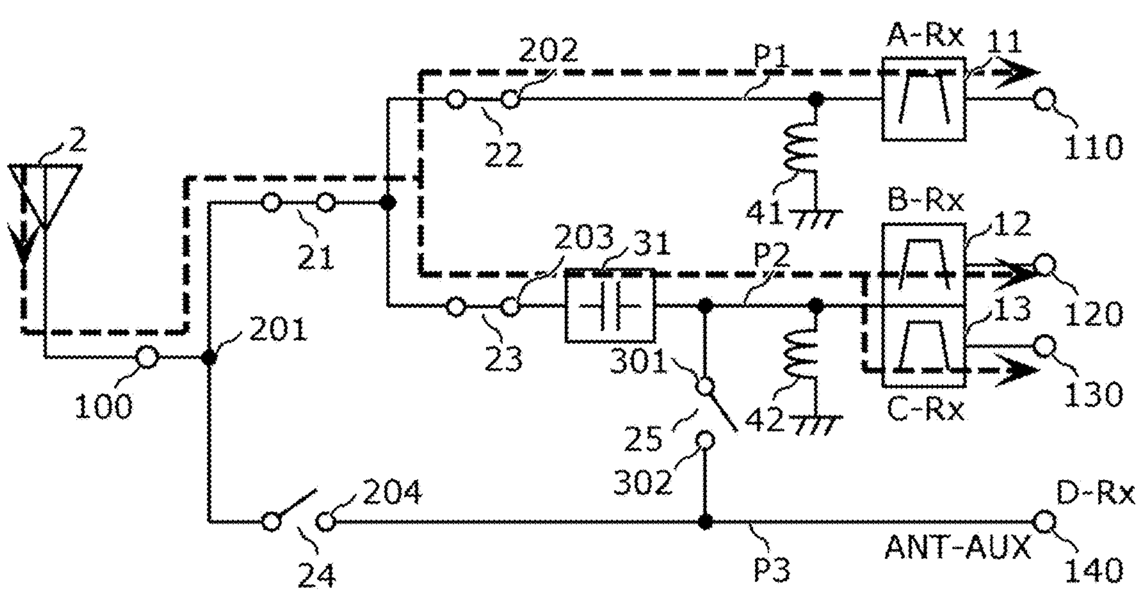
FIG. 3C is a circuit state diagram illustrating a third signal reception mode of the RF circuit according to the embodiment.

FIG. 3C is a circuit state diagram illustrating a third signal reception mode of the RF circuit 1 according to the embodiment. The third signal reception mode is a mode for simultaneously receiving the reception signals in band A, band B, and band C (simultaneous reception in bands A/B/C). In the case of the third signal reception mode, as illustrated in FIG. 3C, the switches 21, 22, and 23 are in a conducting state, and the switches 24 and 25 are in a non-conducting state. In other words, the common terminal 201 and the terminal 202 are connected, the common terminal 201 and the terminal 203 are connected, the common terminal 201 and the terminal 204 are disconnected, and the terminal 301 and the terminal 302 are disconnected.

This allows the reception signal in band B to pass through the antenna connection terminal 100, the switches 21 and 23, the matching circuit 31, and the filter 12, and reach the RF output terminal 120. Additionally, the reception signal in band C passes through the antenna connection terminal 100, the switches 21 and 23, the matching circuit 31, and the filter 13, and reaches the RF output terminal 130. Also, the reception signal in band A passes through the antenna connection terminal 100, the switches 21 and 22, and the filter 11, and reaches the RF output terminal 110.

In the third signal reception mode, the reception signal in band B and the reception signal in band C are transmitted through the signal path P2, and the reception signal in band A is transmitted through the signal path P1. At this time, with the signal paths P1 and P2 commonly connected to the common terminal 201, the matching circuit 31 matches the impedance in the range of bands B and C when viewing the signal path P2 from the common terminal 201 to the reference impedance. Additionally, the attenuation pole in the band D range formed by the LC circuit constituted of the capacitor 310 and the inductor 42 does not affect the band A range. This enables low-loss transmission of the reception signals in bands A, B, and C in the third signal reception mode.

Figure 3D:
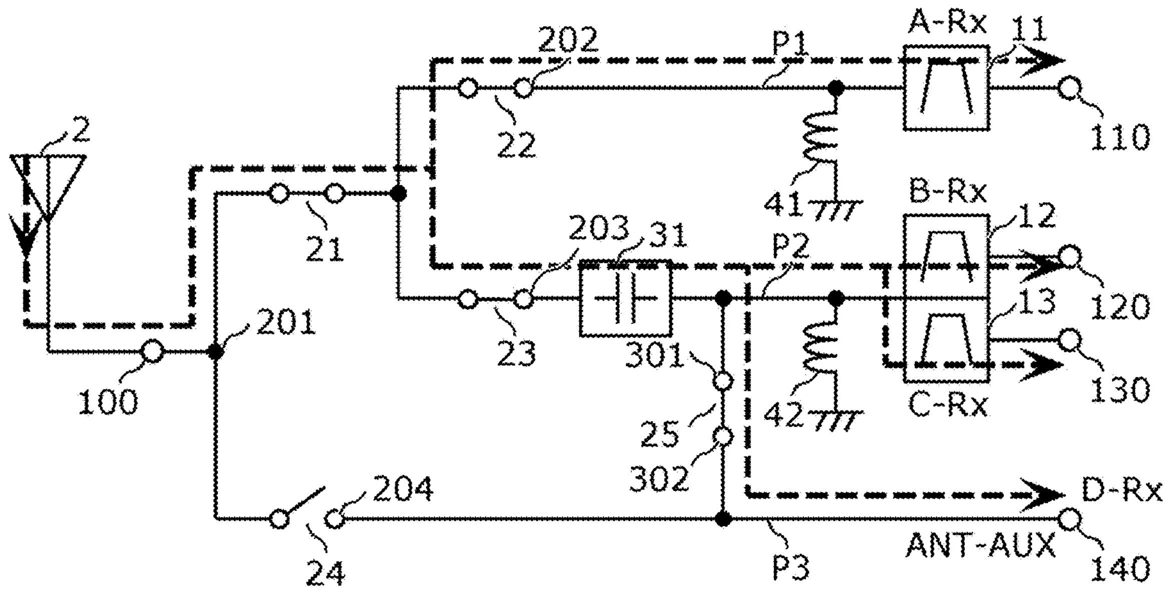
FIG. 3D is a circuit state diagram illustrating a fourth signal reception mode of the RF circuit according to the embodiment.

FIG. 3D is a circuit state diagram illustrating a fourth signal reception mode of the RF circuit 1 according to the embodiment. The fourth signal reception mode is a mode for simultaneously receiving the reception signals in band A, band B, band C, and band D (simultaneous reception in bands A/B/C/D). In the case of the fourth signal reception mode, as illustrated in FIG. 3D, the switches 21, 22, 23, and 25 are in a conducting state, and the switch 24 is in a non-conducting state. In other words, the common terminal 201 and the terminal 202 are connected, the common terminal 201 and the terminal 203 are connected. the common terminal 201 and the terminal 204 are disconnected, and the terminal 301 and the terminal 302 are connected.

This allows the reception signal in band B to pass through the antenna connection terminal 100, the switches 21 and 23, the matching circuit 31, and the filter 12, and reach the RF output terminal 120. Additionally, the reception signal in band C passes through the antenna connection terminal 100, the switches 21 and 23, the matching circuit 31, and the filter 13, and reaches the RF output terminal 130. Also, the reception signal in band A passes through the antenna connection terminal 100, the switches 21 and 22, and the filter 11, and reaches the RF output terminal 110. Furthermore, the reception signal in band D passes through the antenna connection terminal 100, the switches 21 and 23, the matching circuit 31, and the switch 25, and reaches the RF output terminal 140.

In the fourth signal reception mode, the reception signal in band B and the reception signal in band C are transmitted through the signal path P2; the reception signal in band A is transmitted through the signal path P1; and the reception signal in band D is transmitted through the signal path P3. At this time, with the signal paths P1, P2, and P3 commonly connected to the common terminal 201, the matching circuit 31 matches the impedance in the range of bands B and C when viewing the signal path P2 from the common terminal 201 to the reference impedance. Additionally, the attenuation pole in the band D range formed by the LC circuit constituted of the capacitor 310 and the inductor 42 does not affect the band A range. Since the signal path P3 is connected to the connection point between the capacitor 310 and the inductor 42, the attenuation pole in the band D range formed by the LC circuit constituted of the capacitor 310 and the inductor 42 does not affect the signal path P3. This enables low-loss transmission of the reception signals in bands A, B, C, and D in the fourth signal reception mode.

Figure 3E:
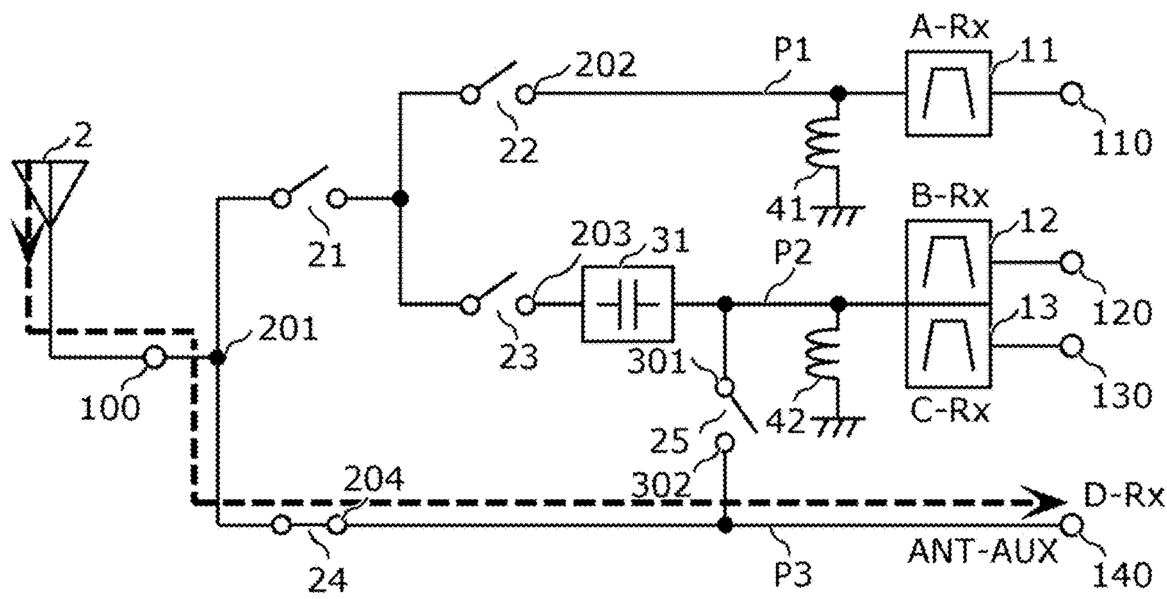
FIG. 3E is a circuit state diagram illustrating a fifth signal reception mode of the RF circuit according to the embodiment.

FIG. 3E is a circuit state diagram illustrating a fifth signal reception mode of the RF circuit 1 according to the embodiment. The fifth signal reception mode is a mode for receiving only the reception signal in band D among bands A, B, C, and D (reception in band D). In the case of the fifth signal reception mode, as illustrated in FIG. 3E, the switches 21, 22, 23, and 25 are in a non-conducting state, and the switch 24 is in a conducting state. In other words, the common terminal 201 and the terminal 202 are disconnected, the common terminal 201 and the terminal 203 are disconnected, the common terminal 201 and the terminal 204 are connected, and the terminal 301 and the terminal 302 are disconnected.

This allows the reception signal in band D to pass through the antenna connection terminal 100 and the switch 24, and reach the RF output terminal 140.

In the fifth signal reception mode, the reception signal in band D is transmitted through the signal path P3. At this time, since the signal path P3 is not connected to the matching circuit 31 for adjusting the impedance in the range of bands B and C, and the reception signal in band D does not pass through the matching circuit 31, the reception signal in band D can be transmitted with low loss. Additionally, in this mode, the signal path P3 is not limited to transmitting band D and is capable of transmitting signals at any frequencies with low loss.

5 Circuit Configuration of RF Circuit 1A According to First Modification

Figure 4:
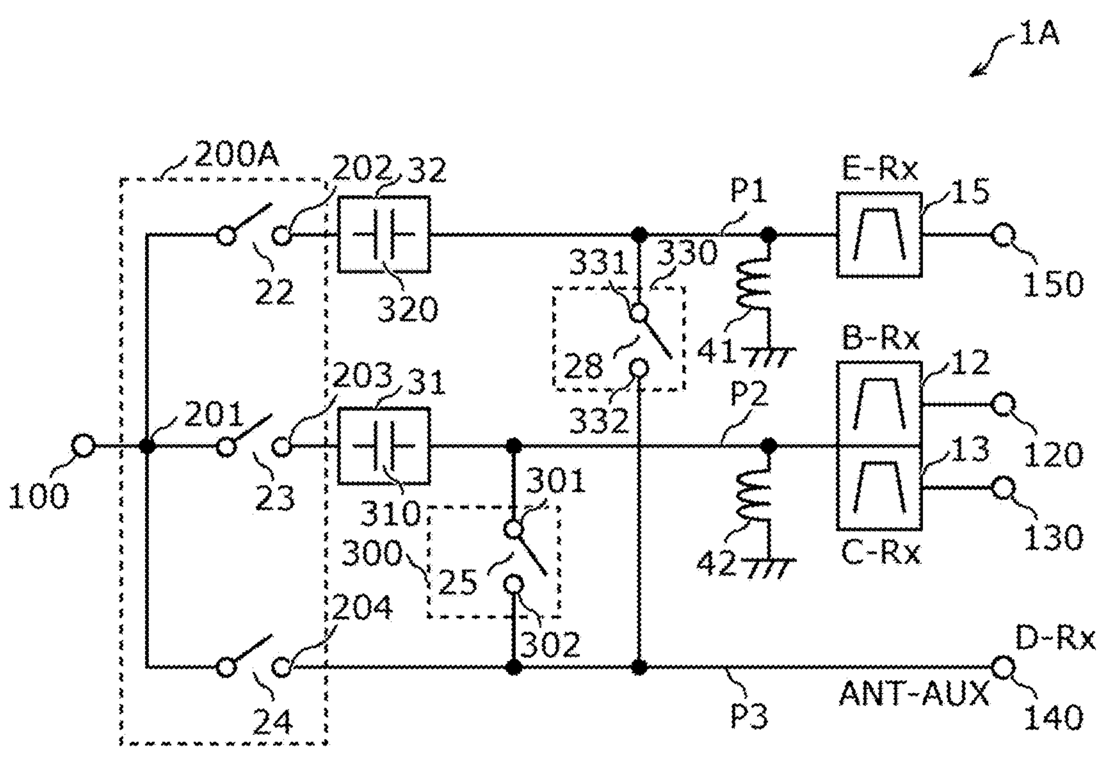
FIG. 4 is a circuit configuration diagram of an RF circuit according to a first modification of the embodiment.

Next, the circuit configuration of an RF circuit 1A according to a first modification will be described. FIG. 4 is a circuit configuration diagram of the RF circuit 1A according to the first modification of the embodiment. As illustrated in the diagram, the RF circuit 1A according to the present modification includes the filters 12, 13, and 15, switches 22, 23, 24, 25, and 28, signal paths P1, P2, and P3, matching circuits 31 and 32, inductors 41 and 42, antenna connection terminal 100, and RF output terminals 120, 130, 140, and 150. The RF circuit 1A according to the present modification differs from the RF circuit 1 according to the embodiment in the point that the matching circuit 32 is arranged in the signal path P1, and that the switch 28 is arranged between the signal path P1 and the signal path P3. Hereinafter, the RF circuit 1A according to the present modification will be described, mainly focusing on different configurations while omitting the description of the same configurations as the RF circuit 1 according to the embodiment.

The RF output terminal 150 is an external connection terminal connected to the signal path P1 and the filter 15.

The switches 22, 23, and 24 constitute a switch circuit 200A. The switch circuit 200A, which is an example of a first switch circuit, has the common terminal 201 (first common terminal), and terminals 202 (first terminal), 203 (second terminal), and 204 (third terminal). One of two ends of the switch 22, one of two ends of the switch 23, and one of two ends of the switch 24 are the common terminal 201; the other end of the switch 22 is the terminal 202; the other end of the switch 23 is the terminal 203; and the other end of the switch 24 is the terminal 204. With the above-mentioned connection configuration, the switch circuit 200A can switch between the connection and disconnection between the common terminal 201 and the terminal 202, can switch between the connection and disconnection between the common terminal 201 and the terminal 203, and can switch between the connection and disconnection between the common terminal 201 and the terminal 204.

The signal path P1 is an example of a first signal path, with one of its ends connected to the terminal 202 and the other end connected to the RF output terminal 150. The signal path P1 can transmit the reception signal in band E (first band).

The signal path P2 is an example of a second signal path, with one of its ends connected to the terminal 203 and the other end connected to the RF output terminals 120 and 130. The signal path P2 can transmit the reception signal in band B (second band) and the reception signal in band C.

The signal path P3 is an example of a third signal path, with one of its ends connected to the terminal 204 and the other end connected to the RF output terminal 140. The signal path P3 can transmit the reception signal in band D (third band).

Note that band E is a band that can be transmitted simultaneously with band D, while band B and band C are bands that can be transmitted simultaneously with band D.

The filter 15, which is an example of a first filter, is arranged in the signal path P1 and has a passband containing the reception band of band E. One of two ends of the filter 15 is connected to the matching circuit 32, and the other end is connected to the RF output terminal 150.

The matching circuit 32 is connected between the terminal 202 and the filter 15. The matching circuit 32 at least includes a capacitor 320. The capacitor 320, which is an example of a second capacitor, is arranged in series in the signal path P1 between the terminal 202 and the filter 15. Note that the matching circuit 32 may include at least one of an inductor and a capacitor in addition to the capacitor 320.

The inductor 41, which is an example of a second inductor, is connected between the signal path P1 between the capacitor 320 and the filter 15 and ground.

The switch 28 constitutes a switch circuit 330. The switch circuit 330, which is an example of a third switch circuit, has terminals 331 (sixth terminal) and 332 (seventh terminal). One of two ends of the switch 28 is the terminal 331, and the other end of the switch 28 is the terminal 332. The switch circuit 330 can switch between the connection and disconnection between the terminal 331 and the terminal 332. The terminal 331 is connected to the signal path P1 between the capacitor 320 and the filter 15, and the terminal 332 is connected to the signal path P3. In the present modification, the terminal 331 is connected to the signal path P1 between the capacitor 320 and the inductor 41; however, the terminal 331 may be connected to the signal path P1 between the inductor 41 and the filter 15.

In the RF circuit 1A according to the present modification, in a mode for simultaneously receiving the reception signals in band E and band D (simultaneous reception in bands E/D), the switches 22 and 28 are in a conducting state, and the switches 23, 24, and 25 are in a non-conducting state. In other words, the common terminal 201 and the terminal 202 are connected, the common terminal 201 and the terminal 203 are disconnected, the common terminal 201 and the terminal 204 are disconnected, and the terminal 331 and the terminal 332 are connected.

This allows the reception signal in band E to pass through the antenna connection terminal 100, the switch 22, the matching circuit 32, and the filter 15, and reach the RF output terminal 150. Additionally, the reception signal in band D passes through the antenna connection terminal 100, the switch 22, the matching circuit 32, and the switch 28, and reaches the RF output terminal 140.

In the mode for simultaneously receiving the reception signals in band E and band D, the reception signal in band E is transmitted through the signal path P1, and the reception signal in band D is transmitted through the signal path P3. At this time, with the signal paths P1 and P3 commonly connected to the common terminal 201 with the matching circuit 32 interposed therebetween, the matching circuit 32 matches the impedance in the band E range when viewing the signal path P1 from the common terminal 201 to the reference impedance. Additionally, since the signal path P3 is connected to the connection point between the capacitor 320 and the inductor 41, the attenuation pole in the band E range formed by the LC circuit constituted of the capacitor 320 and the inductor 41 does not affect the signal path P3. This enables low-loss transmission of the reception signals in bands E and D in the above-mentioned mode.

According to the RF circuit 1A according to the present embodiment, in the case of the first signal reception mode (simultaneous reception in bands B/C/D), the impedance in the range of the reception signals in band B and band C can be adjusted by the LC circuit constituted of the capacitor 310 and the inductor 42, and the use of the signal path P3 passing through the switch circuit 300 can prevent an attenuation pole in band D to be formed in the signal path P3 due to the above-mentioned LC circuit. Thus, the transmission loss of the reception signals in bands B, C, and D can be reduced. Additionally, in the case of the second signal reception mode (simultaneous reception in bands E/D), the impedance in the range of the reception signal in band E can be adjusted by the LC circuit constituted of the capacitor 320 and the inductor 41, and the use of the signal path P3 passing through the switch circuit 330 can prevent an attenuation pole in band D to be formed in the signal path P3 due to the above-mentioned LC circuit. Thus, it is possible to provide the RF circuit 1A, which is capable of simultaneously transmitting signals in multiple bands E, B, C, and D with low loss.

In the present embodiment, band E is, for example, band B7, B39, B40, or B41 for LTE, or band n7, n39, n40, or n41 for 5G-NR. Additionally, band B is, for example, band B1 or B3 for LTE, or band n1 or n3 for 5G-NR. Furthermore, band C is, for example, band B1 or B3 for LTE, or band n1 or n3 for 5G-NR. Also, band D is, for example, band B32, B75, or B76 for LTE, or band n32, n75, or n76 for 5G-NR.

6 Circuit Configuration of RF Circuit 1B According to Second Modification

Figure 5:
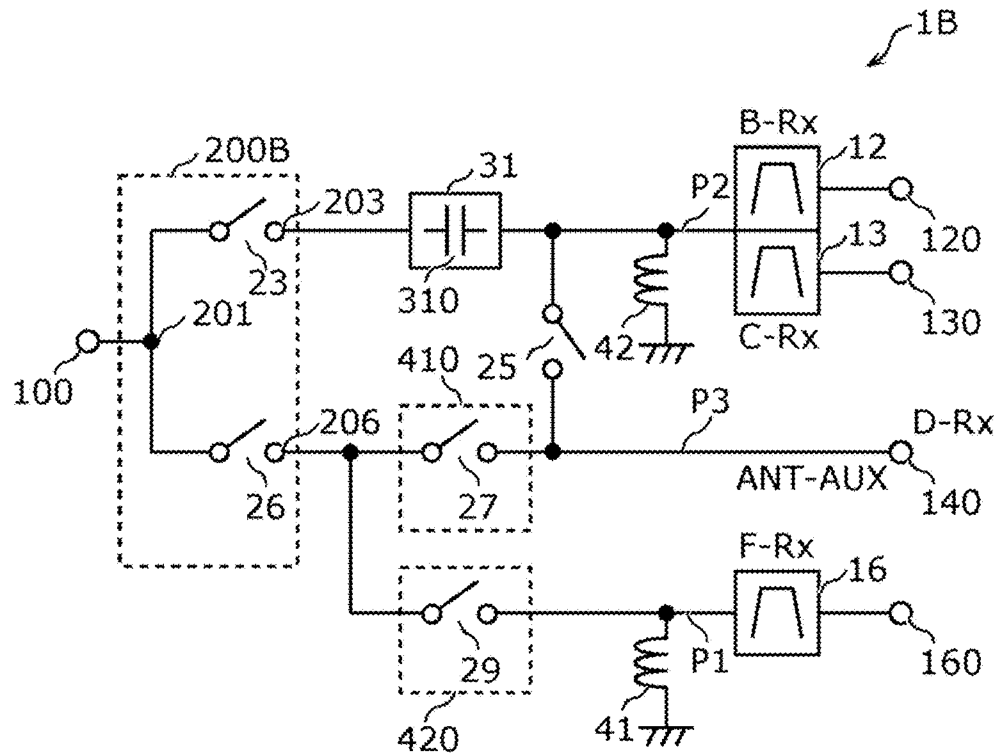
FIG. 5 is a circuit configuration diagram of an RF circuit according to a second modification of the embodiment.

Next, the circuit configuration of an RF circuit 1B according to a second modification will be described. FIG. 5 is a circuit configuration diagram of the RF circuit 1B according to the second modification of the embodiment. As illustrated in the diagram, the RF circuit 1B according to the present modification includes the filters 12, 13, and 16, switches 23, 25, 26, 27, and 29, signal paths P1, P2, and P3, matching circuit 31, inductors 41 and 42, antenna connection terminal 100, and RF output terminals 120, 130, 140, and 160. The RF circuit 1B according to the present modification mainly differs from the RF circuit 1 according to the embodiment in the point that switch circuits are arranged in multiple stages between the antenna connection terminal 100 and the signal paths P1 and P3. Hereinafter, the RF circuit 1B according to the present modification will be described, mainly focusing on different configurations while omitting the description of the same configurations as the RF circuit 1 according to the embodiment.

The RF output terminal 160 is an external connection terminal connected to the signal path P1 and the filter 16.

The switches 23 and 26 constitute a switch circuit 200B. The switch circuit 200B, which is an example of a first switch circuit, has the common terminal 201 (first common terminal), and terminals 203 (second terminal) and 206 (first terminal and third terminal). One of two ends of the switch 23 and one of two ends of the switch 26 are the common terminal 201; the other end of the switch 23 is the terminal 203; and the other end of the switch 26 is the terminal 206. With the above-mentioned connection configuration, the switch circuit 200B can switch between the connection and disconnection between the common terminal 201 and the terminal 203, and can switch between the connection and disconnection between the common terminal 201 and the terminal 206.

The signal path P1 is an example of a first signal path, with one of its ends connected to the terminal 206 and the other end connected to the RF output terminal 160. The signal path P1 can transmit the reception signal in band F (first band).

The signal path P2 is an example of a second signal path, with one of its ends connected to the terminal 203 and the other end connected to the RF output terminals 120 and 130. The signal path P2 can transmit the reception signal in band B (second band) and the reception signal in band C.

The signal path P3 is an example of a third signal path, with one of its ends connected to the terminal 206 and the other end connected to the RF output terminal 140. The signal path P3 can transmit the reception signal in band D (third band).

Note that band F is a band that can be transmitted simultaneously with band D, while band B and band C are bands that can be transmitted simultaneously with band D.

Note that, in the present modification, a first terminal of a first switch circuit (switch circuit 200B) to which the signal path P1 is connected and a third terminal of the first switch circuit (switch circuit 200B) to which the signal path P3 is connected are the same terminal 206.

The filter 16, which is an example of a first filter, is arranged in the signal path P1 and has a passband containing the reception band of band F. One of two ends of the filter 16 is connected to the switch 29, and the other end is connected to the RF output terminal 160.

The inductor 41 is connected between the signal path P1 between the switch 29 and the filter 16 and ground.

The switch 27 constitutes a switch circuit 410. The switch circuit 410, which is an example of a fourth switch circuit, is arranged in the signal path P3 between the terminal 206 and the terminal 302 of the switch circuit 300, and can switch between the connection and disconnection between the terminal 206 and the terminal 302.

The switch 29 constitutes a switch circuit 420. The switch circuit 420, which is an example of a fifth switch circuit, is arranged in the signal path P1 between the terminal 206 and the filter 16, and can switch between the connection and disconnection between the terminal 206 and the filter 16.

According to the RF circuit 1B according to the present modification, in the case of the first signal reception mode (simultaneous reception in bands B/C/D), the switches 23 and 25 are in a conducting state, and the switches 26, 27, and 29 are in a non-conducting state. Accordingly, the impedance in the range of the reception signals in band B and band C can be adjusted by the LC circuit constituted of the capacitor 310 and the inductor 42, and the use of the signal path P3 passing through the switch circuit 300 (switch 25) can prevent an attenuation pole in band D to be formed in the signal path P3 due to the above-mentioned LC circuit. Thus, the transmission loss of the reception signals in bands B, C, and D can be reduced. Additionally, in the case of the second signal reception mode (simultaneous reception in bands F/D), the switches 26, 27, and 29 are in a conducting state, and the switches 23 and 25 are in a non-conducting state. Accordingly, the use of the signal paths P1 and P3 passing through the switch circuit 200B and not passing through the switch circuit 300 (switch 25) can reduce the transmission loss of the reception signals in bands F and D. Thus, it is possible to provide the RF circuit 1B, which is capable of simultaneously transmitting signals in multiple bands F, B, C, and D with low loss.

Furthermore, the series-connected switch circuits 200B and 420 are arranged between the antenna connection terminal 100 and the signal path P1, and the series-connected switch circuits 200B and 410 are arranged between the antenna connection terminal 100 and the signal path P3. This can enhance the electric power handling capability (and breakage durability) of the signal paths P1 and P3.

In the present embodiment, band F is, for example, band B7, B39, B40, or B41 for LTE, or band n7, n39, n40, or n41 for 5G-NR. Additionally, band B is, for example, band B1 or B3 for LTE, or band n1 or n3 for 5G-NR. Furthermore, band C is, for example, band B1 or B3 for LTE, or band n1 or n3 for 5G-NR. Also, band D is, for example, band B32, B75, or B76 for LTE, or band n32, n75, or n76 for 5G-NR.

7 Circuit Configuration of RF Circuit 1C According to Third Modification

Figure 6:
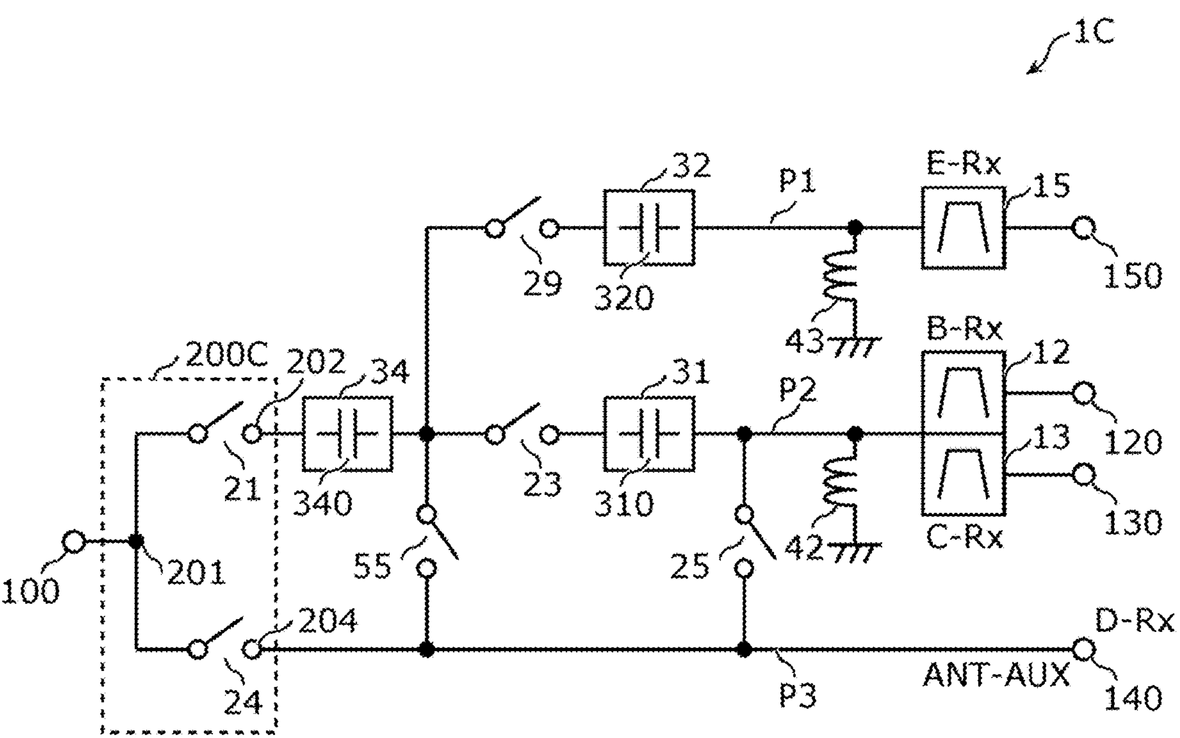
FIG. 6 is a circuit configuration diagram of an RF circuit according to a third modification of the embodiment.

Next, the circuit configuration of an RF circuit 1C according to a third modification will be described. FIG. 6 is a circuit configuration diagram of the RF circuit 1C according to the third modification of the embodiment. As illustrated in the diagram, the RF circuit 1C according to the present modification includes the filters 12, 13, and 15, switches 21, 23, 24, 25, 29, and 55, signal paths P1, P2, and P3, matching circuits 31, 32, and 34, inductors 42 and 43, antenna connection terminal 100, and RF output terminals 120, 130, 140, and 150. The RF circuit 1C according to the present modification differs from the RF circuit 1 according to the embodiment in the arrangement of the matching circuits and switches. Hereinafter, the RF circuit 1C according to the present modification will be described, mainly focusing on different configurations while omitting the description of the same configurations as the RF circuit 1 according to the embodiment.

The RF output terminal 150 is an external connection terminal connected to the signal path P1 and the filter 15.

The switches 21 and 24 constitute a switch circuit 200C. The switch circuit 200C, which is an example of a first switch circuit, has the common terminal 201 (first common terminal), and terminals 202 (first terminal and second terminal) and 204 (third terminal). One of two ends of the switch 21 and one of two ends of the switch 24 are the common terminal 201; the other end of the switch 21 is the terminal 202; and the other end of the switch 24 is the terminal 204. With the above-mentioned connection configuration, the switch circuit 200C can switch between the connection and disconnection between the common terminal 201 and the terminal 202, and can switch between the connection and disconnection between the common terminal 201 and the terminal 204.

The signal path P1 is an example of a first signal path, with one of its ends connected to the terminal 202 with the matching circuit 34 interposed therebetween, and the other end connected to the RF output terminal 150. The signal path P1 can transmit the reception signal in band E (first band).

The signal path P2 is an example of a second signal path, with one of its ends connected to the terminal 202 with the matching circuit 34 interposed therebetween, and the other end connected to the RF output terminals 120 and 130. The signal path P2 can transmit the reception signal in band B (second band) and the reception signal in band C.

The signal path P3 is an example of a third signal path, with one of its ends connected to the terminal 204 and the other end connected to the RF output terminal 140. The signal path P3 can transmit the reception signal in band D (third band).

Note that, in the present modification, a first terminal of a first switch circuit (switch circuit 200C) to which the signal path P1 is connected and a second terminal of the first switch circuit (switch circuit 200C) to which the signal path P2 is connected are the same terminal 202.

Note that band E is a band that can be transmitted simultaneously with band D, while band B and band C are bands that can be transmitted simultaneously with band D.

The filter 15, which is an example of a first filter, is arranged in the signal path P1 and has a passband containing the reception band of band E. One of two ends of the filter 15 is connected to the matching circuit 32, and the other end is connected to the RF output terminal 150.

The matching circuit 32 is connected between the switch 29 and the filter 15. The matching circuit 32 at least includes the capacitor 320. The capacitor 320 is arranged in series in the signal path P1 between the switch 29 and the filter 15. The matching circuit 34 is connected between the terminal 202 and the switches 23, 29, and 55. The matching circuit 34 at least includes a capacitor 340.

The inductor 43 is connected between the signal path P1 between the capacitor 320 and the filter 15 and ground.

The switch 23 is arranged in the signal path P2 between the matching circuits 34 and 31 and can switch between the connection and disconnection between the matching circuit 34 and the signal path P2. The switch 29 is arranged in the signal path P1 between the matching circuits 34 and 32 and can switch between the connection and disconnection between the matching circuit 34 and the signal path P1. The switch 55 is arranged between the matching circuit 34 and the signal path P3 and can switch between the connection and disconnection between the matching circuit 34 and the signal path P3.

According to the RF circuit 1C according to the present modification, in the case of the first signal reception mode (simultaneous reception in bands B/C/D), the impedance in the range of the reception signals in band B and band C can be adjusted by the LC circuit constituted of the capacitor 310 and the inductor 42, and the use of the signal path P3 passing through the switch 25 can prevent an attenuation pole in band D to be formed in the signal path P3 due to the above-mentioned LC circuit. Thus, the transmission loss of the reception signals in bands B, C, and D can be reduced. Additionally, in the case of the second signal reception mode (simultaneous reception in bands E/D), the use of the signal paths P1 and P3 not passing through the switch 25 can reduce the transmission loss of the reception signals in bands E and D. Thus, it is possible to provide the RF circuit 1C, which is capable of simultaneously transmitting signals in multiple bands E, B, C, and D with low loss.

In the present embodiment, band E is, for example, band B7, B39, B40, or B41 for LTE, or band n7, n39, n40, or n41 for 5G-NR. Additionally, band B is, for example, band B1 or B3 for LTE, or band n1 or n3 for 5G-NR. Furthermore, band C is, for example, band B1 or B3 for LTE, or band n1 or n3 for 5G-NR. Also, band D is, for example, band B32, B75, or B76 for LTE, or band n32, n75, or n76 for 5G-NR.

8 Circuit Configuration of RF Circuit 1D According to Fourth Modification

Figure 7:
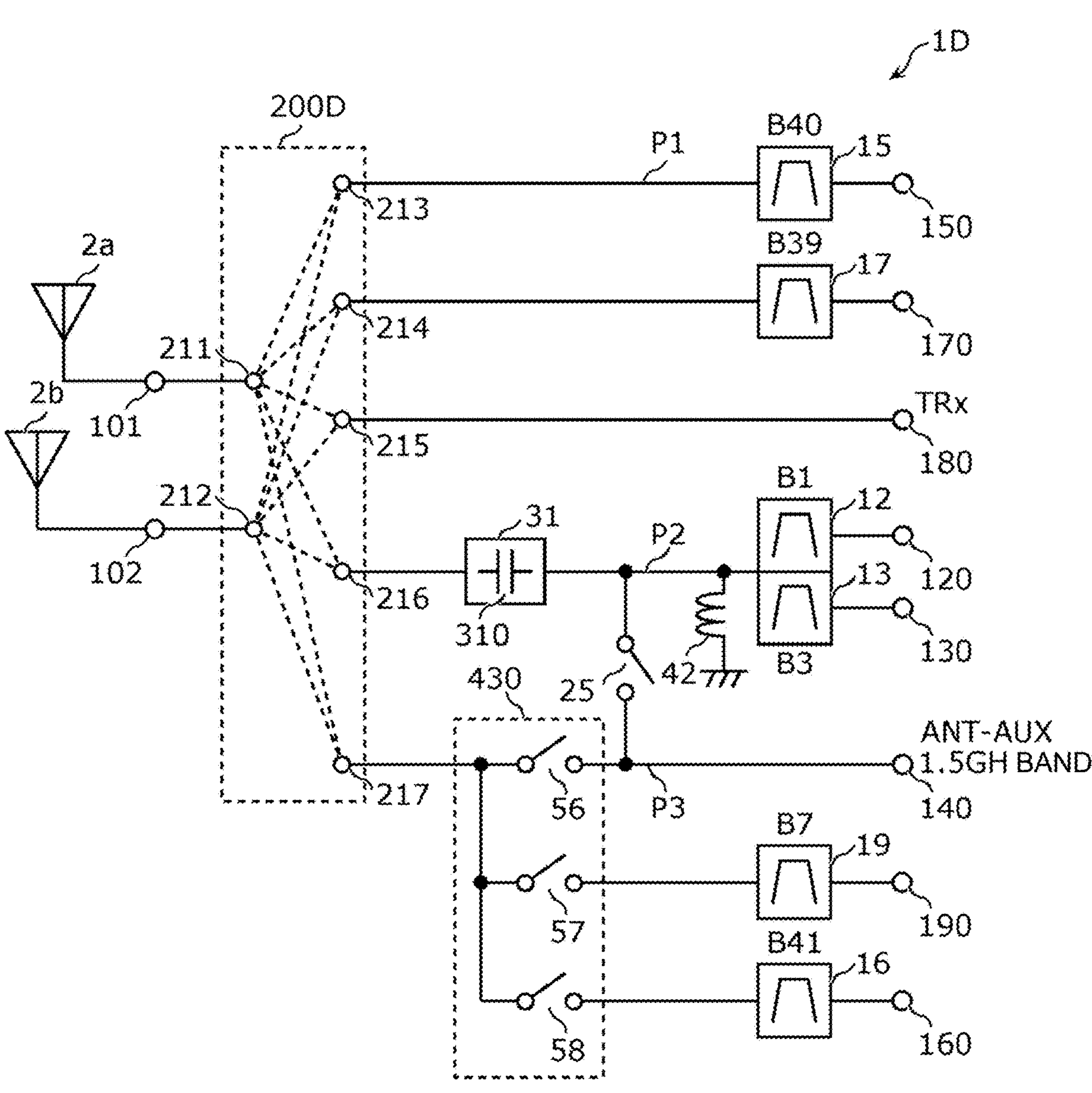
FIG. 7 is a circuit configuration diagram of an RF circuit according to a fourth modification of the embodiment.

Next, the circuit configuration of an RF circuit 1D according to a fourth modification will be described. FIG. 7 is a circuit configuration diagram of the RF circuit 1D according to the fourth modification of the embodiment. As illustrated in the diagram, the RF circuit 1D according to the present modification includes the filters 12, 13, 15, 16, 17, and 19, switch circuits 200D and 430, switch 25, signal paths P1, P2, and P3, matching circuit 31, inductor 42, antenna connection terminals 101 and 102, and RF output terminals 120, 130, 140, 150, 160, 170, 180, and 190. The RF circuit 1D according to the present modification differs from the RF circuit 1 according to the embodiment in the configuration of the filters and switch circuits. Hereinafter, the RF circuit 1D according to the present modification will be described, mainly focusing on different configurations while omitting the description of the same configurations as the RF circuit 1 according to the embodiment.

The antenna connection terminal 101, which is an example of a first antenna connection terminal, is connected to an antenna 2*a* and to a common terminal 211 (first common terminal) of the switch circuit 200D. The antenna connection terminal 102, which is an example of a second antenna connection terminal, is connected to an antenna 2*b* and to a common terminal 212 (second common terminal) of the switch circuit 200D. The RF output terminal 150 is an external connection terminal connected to the signal path P1 and the filter 15. The RF output terminal 160 is an external connection terminal connected to a terminal 217 of the switch circuit 200D with the switch circuit 430 interposed therebetween. The RF output terminal 170 is an external connection terminal connected to a terminal 214 of the switch circuit 200D. The RF output terminal 180 is an external connection terminal connected to a terminal 215 of the switch circuit 200D. The RF output terminal 190 is an external connection terminal connected to the terminal 217 of the switch circuit 200D with the switch circuit 430 interposed therebetween. Note that the RF output terminals 120 to 190 need not be included in the RF circuit 1D.

The switch circuit 200D, which is an example of a first switch circuit, has the common terminals 211 (first common terminal) and 212 (second common terminal), and terminals 213 (first terminal), 214, 215, 216 (second terminal), and 217 (third terminal). With the above-mentioned connection configuration, the switch circuit 200D can switch the connection between the common terminal 211 and any one of the terminals 213 to 217, and can switch the connection between the common terminal 212 and any one of the terminals 213 to 217. The switch circuit 200D is constituted of, for example, a DP5T (Double-Pole 5-Throw)-type switch. Note that the terminals 214 and 215 need not be provided.

The signal path P1 is an example of a first signal path, with one of its ends connected to the terminal 213 (first terminal), and the other end connected to the RF output terminal 150. The signal path P1 can transmit, for example, the reception signal in band E (first band).

The signal path P2 is an example of a second signal path, with one of its ends connected to the terminal 216 (second terminal), and the other end connected to the RF output terminals 120 and 130. The signal path P2 can transmit, for example, the reception signal in band B (second band) and the reception signal in band C.

The signal path P3 is an example of a third signal path, with one of its ends connected to the terminal 217 (third terminal) with the switch circuit 430 interposed therebetween, and the other end connected to the RF output terminal 140. The signal path P3 can transmit, for example, the reception signal in band D (third band). Band D includes, for example, the 1.5-GHz band.

The filter 15, which is an example of a first filter, is arranged in the signal path P1 and has a passband containing the reception band of band E (first band). Band E is, for example, band B40 for LTE or band n40 for 5G-NR. One of two ends of the filter 15 is connected to the terminal 213, and the other end is connected to the RF output terminal 150.

The filter 12, which is an example of a second filter, is arranged in the signal path P2 and has a passband containing the reception band of band B (second band). Band B is, for example, band B1 for LTE or band n1 for 5G-NR. One of two ends of the filter 12 is connected to the matching circuit 31, and the other end is connected to the RF output terminal 120. The filter 13 is arranged in the signal path P2, and has a passband containing the reception band of band C. Band C is, for example, band B3 for LTE or band n3 for 5G-NR. Note that the filter 13 need not be included in the RF circuit 1D.

The filter 17 has a passband containing the reception band of band B39 for LTE or band n39 for 5G-NR. One of two ends of the filter 17 is connected to the terminal 214, and the other end is connected to the RF output terminal 170. The filter 16 has a passband containing the reception band of band B41 for LTE or band n41 for 5G-NR. One of two ends of the filter 16 is connected to the switch 58, and the other end is connected to the RF output terminal 160. The filter 19 has a passband containing the reception band of band B7 for LTE or band n7 for 5G-NR. One of two ends of the filter 19 is connected to the switch 57, and the other end is connected to the RF output terminal 190. Note that the filters 16, 17, and 19 need not be provided.

The matching circuit 31 is connected between the terminal 216 and the filters 12 and 13. The matching circuit 31 at least includes the capacitor 310. The capacitor 310, which is an example of a first capacitor, is arranged in series in the signal path P2 between the terminal 216 and the filter 12. Note that the matching circuit 31 may include at least one of an inductor and a capacitor in addition to the capacitor 310.

The inductor 42, which is an example of a first inductor, is connected between the signal path P2 between the capacitor 310 and the filter 12 and ground.

The switch 25 constitutes a second switch circuit. The second switch circuit has a fourth terminal and a fifth terminal. One of two ends of the switch 25 is the fourth terminal, and the other end of the switch 25 is the fifth terminal. The switch 25 can switch between the connection and disconnection between the fourth terminal and the fifth terminal. The fourth terminal is connected to the signal path P2 between the capacitor 310 and the filter 12, and the fifth terminal is connected to the signal path P3.

The switch circuit 430 includes switches 56, 57, and 58. One of two ends of the switch 56 is connected to the terminal 217, and the other end is connected to the RF output terminal 140. One of two ends of the switch 57 is connected to the terminal 217, and the other end is connected to the RF output terminal 190 with the filter 19 interposed therebetween. One of two ends of the switch 58 is connected to the terminal 217, and the other end is connected to the RF output terminal 160 with the filter 16 interposed therebetween.

In the case of the first signal reception mode (simultaneous reception in bands B/C/D), the common terminal 211 and the terminal 216 are connected, the common terminal 212 and the terminal 216 are connected, and the switch 25 is in a conducting state. This allows the reception signal in band B to pass through the antenna 2*a*, the antenna connection terminal 101, the switch circuit 200D, the matching circuit 31, and the filter 12, and reach the RF output terminal 120. Additionally, the reception signal in band C passes through the antenna 2*a*, the antenna connection terminal 101, the switch circuit 200D, the matching circuit 31, and the filter 13, and reaches the RF output terminal 130. Furthermore, the reception signal in band D passes through the antenna 2*b*, the antenna connection terminal 102, the switch circuit 200D, the matching circuit 31, and the switch 25, and reaches the RF output terminal 140.

In the first signal reception mode, the reception signal in band B and the reception signal in band C are transmitted through the signal path P2, and the reception signal in band D is transmitted through the signal path P3. At this time, with the signal paths P2 and P3 commonly connected to the terminal 216 with the matching circuit 31 interposed therebetween, the matching circuit 31 matches the impedance in the range of bands B and C when viewing the signal path P2 from the terminal 216 to the reference impedance. Since the signal path P3 is connected to the connection point between the capacitor 310 and the inductor 42, the attenuation pole in the band D range formed by the LC circuit constituted of the capacitor 310 and the inductor 42 does not affect the signal path P3. This enables low-loss transmission of the reception signals in bands B, C, and D in the first signal reception mode.

In the case of the second signal reception mode (simultaneous reception in bands E/D), the common terminal 211 and the terminal 213 are connected, the common terminal 212 and the terminal 217 are connected, and the switch 56 is in a conducting state. This allows the reception signal in band E to pass through the antenna 2*a*, the antenna connection terminal 101, the switch circuit 200D, and the filter 15, and reach the RF output terminal 150. Additionally, the reception signal in band D passes through the antenna 2*b*, the antenna connection terminal 102, the switch circuit 200D, and the switch 56, and reaches the RF output terminal 140.

In the second signal reception mode, the reception signal in band E is transmitted through the signal path P1, and the reception signal in band D is transmitted through the signal path P3. At this time, the signal paths P1 and P3 are not connected to the matching circuit 31 for adjusting the impedance in the range of bands B and C, and the reception signal in band E and the reception signal in band D do not pass through the matching circuit 31; thus, the reception signal in band E and the reception signal in band D can be transmitted with low loss.

According to the RF circuit 1D according to the present modification, signals in multiple bands A, B, C, and D that are received with multiple antennas can be transmitted simultaneously with low loss.

9 Effects, Etc

As described above, the RF circuit 1 according to the present embodiment includes: the switch circuit 200 having the common terminal 201, and the terminals 202, 203, and 204; the signal path P1 connected to the terminal 202; the filter 11 arranged in the signal path P1 and having a passband containing the reception band of band A; the signal path P2 connected to the terminal 203; the filter 12 arranged in the signal path P2 and having a passband containing the reception band of band B; the signal path P3 connected to the terminal 204 and transmitting the reception signal in band D, which can be transmitted simultaneously with band A and can be transmitted simultaneously with band B; the capacitor 310 arranged in series in the signal path P2 between the terminal 203 and the filter 12; the inductor 42 connected between the signal path P2 between the capacitor 310 and the filter 12 and ground; and the switch circuit 300 having the terminals 301 and 302, the terminal 301 connected to the signal path P2 between the capacitor 310 and the filter 12, and the terminal 302 connected to the signal path P3.

Accordingly, in the case of the first signal reception mode (simultaneous reception in bands B/D), the impedance in the range of the reception signal in band B can be adjusted by the LC circuit constituted of the capacitor 310 and the inductor 42, and the use of the signal path P3 passing through the switch circuit 300 can prevent an attenuation pole in band D to be formed in the signal path P3 due to the above-mentioned LC circuit. Thus, the transmission loss of the reception signals in bands B and D can be reduced. Additionally, in the case of the second signal reception mode (simultaneous reception in bands A/D), the use of the signal paths P1 and P3 passing through the switch circuit 200 and not passing through the switch circuit 300 can reduce the transmission loss of the reception signals in bands A and D. Thus, it is possible to provide the RF circuit 1, which is capable of simultaneously transmitting signals in multiple bands A, B, C, and D with low loss.

Additionally, for example, in the RF circuit 1, the switch circuit 200 can switch between the connection and disconnection between the common terminal 201 and the terminal 202, can switch between the connection and disconnection between the common terminal 201 and the terminal 203, and can switch between the connection and disconnection between the common terminal 201 and the terminal 204; the switch circuit 300 can switch between the connection and disconnection between the terminal 301 and the terminal 302; in the case of simultaneously receiving the reception signal in band D and the reception signal in band B, the common terminal 201 and the terminal 203 are connected, the common terminal 201 and the terminal 204 are disconnected, and the terminal 301 and the terminal 302 are connected; and in the case of simultaneously receiving the reception signal in band D and the reception signal in band A, the common terminal 201 and the terminal 202 are connected, the common terminal 201 and the terminal 204 are connected, the common terminal 201 and the terminal 203 are disconnected, and the terminal 301 and the terminal 302 are disconnected.

Accordingly, in the first signal reception mode (simultaneous reception in bands B/D) and the second signal reception mode (simultaneous reception in bands A/D), signals in multiple bands A, B, and D can be transmitted simultaneously with low loss.

Additionally, for example, in the RF circuit 1, in the case of simultaneously receiving the reception signal in band A and the reception signal in band B, the common terminal 201 and the terminal 202 are connected, the common terminal 201 and the terminal 203 are connected, the common terminal 201 and the terminal 204 are disconnected, and the terminal 301 and the terminal 302 are disconnected.

Accordingly, in the third signal reception mode (simultaneous reception in bands A/B), the reception signal in band B is transmitted through the signal path P2, and the reception signal in band A is transmitted through the signal path P1. At this time, with the signal paths P1 and P2 commonly connected to the common terminal 201, the matching circuit 31 matches the impedance in the band B range when viewing the signal path P2 from the common terminal 201 to the reference impedance. Additionally, the attenuation pole in the band D range formed by the LC circuit constituted of the capacitor 310 and the inductor 42 does not affect the band A range. This enables low-loss transmission of the reception signals in bands A and B in the third signal reception mode.

Additionally, for example, in the RF circuit 1, in the case of simultaneously receiving the reception signal in band A, the reception signal in band B, and the reception signal in band D, the common terminal 201 and the terminal 202 are connected, the common terminal 201 and the terminal 203 are connected, the common terminal 201 and the terminal 204 are disconnected, and the terminal 301 and the terminal 302 are connected.

Accordingly, in the fourth signal reception mode (simultaneous reception in bands A/B/D), the reception signal in band B is transmitted through the signal path P2, the reception signal in band A is transmitted through the signal path P1, and the reception signal in band D is transmitted through the signal path P3. At this time, with the signal paths P1, P2, and P3 commonly connected to the common terminal 201, the matching circuit 31 matches the impedance in the band B range when viewing the signal path P2 from the common terminal 201 to the reference impedance. Additionally, the attenuation pole in the band D range formed by the LC circuit constituted of the capacitor 310 and the inductor 42 does not affect the band A range. Since the signal path P3 is connected to the connection point between the capacitor 310 and the inductor 42, the attenuation pole in the band D range formed by the LC circuit constituted of the capacitor 310 and the inductor 42 does not affect the signal path P3. This enables low-loss transmission of the reception signals in bands A, B, and D in the fourth signal reception mode.

Additionally, for example, in the RF circuit 1, in the case of simultaneously receiving only the reception signal in band D among bands A, B, and D, the common terminal 201 and the terminal 204 are connected, the common terminal 201 and the terminal 202 are disconnected, the common terminal 201 and the terminal 203 are disconnected, and the terminal 301 and the terminal 302 are disconnected.

Accordingly, in the fifth signal reception mode (reception in band D), the reception signal in band D is transmitted through the signal path P3. At this time, since the reception signal in band D does not pass through the matching circuit 31 for adjusting the impedance in the range of band B, the reception signal in band D can be transmitted with low loss.

Additionally, for example, the RF circuit 1A according to the first modification further includes the capacitor 320 arranged in series in the signal path P1 between the terminal 202 and the filter 15, the inductor 41 connected between the signal path P1 between the capacitor 320 and the filter 15 and ground, and the switch circuit 330 having the terminals 331 and 332, the terminal 331 connected to the signal path P1 between the capacitor 320 and the filter 15, and the terminal 332 connected to the signal path P3.

Accordingly, in the case of the first signal reception mode (simultaneous reception in bands B/D), the impedance in the range of the reception signal in band B can be adjusted by the LC circuit constituted of the capacitor 310 and the inductor 42, and the use of the signal path P3 passing through the switch circuit 300 can prevent an attenuation pole in band D to be formed in the signal path P3 due to the above-mentioned LC circuit. Thus, the transmission loss of the reception signals in bands B and D can be reduced. Additionally, in the case of the second signal reception mode (simultaneous reception in bands E/D), the impedance in the range of the reception signal in band E can be adjusted by the LC circuit constituted of the capacitor 320 and the inductor 41, and the use of the signal path P3 passing through the switch circuit 330 can prevent an attenuation pole in band D to be formed in the signal path P3 due to the above-mentioned LC circuit. Thus, it is possible to provide the RF circuit 1A, which is capable of simultaneously transmitting signals in multiple bands E, B, and D with low loss.

Additionally, for example, in the RF circuit 1A according to the first modification, the switch circuit 330 can switch between the connection and disconnection between the terminal 331 and the terminal 332; in the case of simultaneously receiving a third reception signal in band D and a second reception signal in band B, the common terminal 201 and the terminal 203 are connected, the common terminal 201 and the terminal 204 are disconnected, and the terminal 301 and the terminal 302 are connected; and in the case of simultaneously receiving the third reception signal in band D and a first reception signal in band E, the common terminal 201 and the terminal 202 are connected, the common terminal 201 and the terminal 204 are disconnected, and the terminal 331 and the terminal 332 are connected.

Accordingly, in the first signal reception mode (simultaneous reception in bands B/D) and the second signal reception mode (simultaneous reception in bands E/D), signals in multiple bands E, B, and D can be transmitted simultaneously with low loss.

Furthermore, for example, in the RF circuit 1B according to the second modification, the terminal 202 and the terminal 204 in the RF circuit 1 are the single terminal 206; the RF circuit 1B further includes the switch circuit 410 arranged in the signal path P3 between the terminal 206 and (the terminal 302 of) the switch 25 and switching between the connection and disconnection between the terminal 206 and the switch 25, and the switch circuit 420 arranged in the signal path P1 between the terminal 206 and the filter 16 and switching between the connection and disconnection between the terminal 206 and the filter 16.

Accordingly, the series-connected switch circuits 200B and 420 are arranged between the antenna connection terminal 100 and the signal path P1, and the series-connected switch circuits 200B and 410 are arranged between the antenna connection terminal 100 and the signal path P3. This can enhance the electric power handling capability (and breakage durability) of the signal paths P1 and P3.

In addition, for example, in the RF circuit 1D according to the fourth modification, the switch circuit 200D has the common terminals 211 and 212, and the terminals 213, 214, 215, 216, and 217; the RF circuit 1D further includes the antenna connection terminals 101 and 102; the common terminal 211 is connected to the antenna connection terminal 101; the common terminal 212 is connected to the antenna connection terminal 102; and the switch circuit 200D can switch the connection between the common terminal 211 and any one of 213 to 217, and can switch the connection between the common terminal 212 and any one of 213 to 217.

Accordingly, signals in multiple bands A, B, and D that are received with multiple antennas can be transmitted simultaneously with low loss.

Additionally, for example, in the RF circuits 1, 1A, 1B, 1C, and 1D, bands A, E, and F are band B7, B39, B40, or B41 for LTE, or band n7, n39, n40, or n41 for 5G-NR; band B is band B1 or B3 for LTE, or band n1 or n3 for 5G-NR; and band D is band B32, B75, or B76 for LTE, or band n32, n75, or n76 for 5G-NR.

Other Embodiments

The RF circuit according to the present disclosure has been described above with reference to the embodiment and modifications, but the RF circuit according to the present disclosure is not limited to the embodiment and modifications described above. Another embodiment implemented by combining any components from the above embodiment and modifications, as well as modifications obtained by applying various changes conceived by those skilled in the art without necessarily departing from the spirit of the present disclosure to the above embodiment and modifications, and various devices incorporating the above-mentioned RF circuit are also included in the present disclosure.

For example, in the circuit configuration of the RF circuits according to the above embodiment and modifications, other circuit elements and wiring may be inserted between the circuit elements and the paths connecting the signal paths depicted in the drawings.

Also, while cellular bands for 5G-NR or LTE are used in the above embodiment, communication bands for other wireless access technology may be used in addition to or instead of 5G-NR or LTE. For example, communication bands for a wireless local area network may be used.

Hereinafter, the characteristics of the RF circuits described based on the above embodiment and modifications will be described.

<1>

A radio-frequency circuit comprising:
- a first switch circuit having a first common terminal, a first terminal, a second terminal, and a third terminal;
- a first signal path connected to the first terminal;
- a first filter arranged in the first signal path and having a passband containing a reception band of a first band;
- a second signal path connected to the second terminal;
- a second filter arranged in the second signal path and having a passband containing a reception band of a second band;
- a third signal path connected to the third terminal, and transmitting a reception signal in a third band that can be transmitted simultaneously with the first band and can be transmitted simultaneously with the second band;
- a first capacitor arranged in series in the second signal path between the second terminal and the second filter;
- a first inductor connected between the second signal path between the first capacitor and the second filter and ground; and
- a second switch circuit having a fourth terminal and a fifth terminal, the fourth terminal connected to the second signal path between the first capacitor and the second filter, and the fifth terminal connected to the third signal path.

<2>

The radio-frequency circuit according to <1>, wherein:
- the first switch circuit
- can switch between a connection and disconnection between the first common terminal and the first terminal,
- can switch between a connection and disconnection between the first common terminal and the second terminal, and
- can switch between a connection and disconnection between the first common terminal and the third terminal;
- the second switch circuit
- can switch between a connection and disconnection between the fourth terminal and the fifth terminal;
- in a case of simultaneously receiving a reception signal in the third band and a reception signal in the second band, the first common terminal and the second terminal are connected, the first common terminal and the third terminal are disconnected, and the fourth terminal and the fifth terminal are connected; and in a case of simultaneously receiving the reception signal in the third band and a reception signal in the first band, the first common terminal and the first terminal are connected, the first common terminal and the third terminal are connected, the first common terminal and the second terminal are disconnected, and the fourth terminal and the fifth terminal are disconnected.

<3>

The radio-frequency circuit according to <1> or <2>, wherein, in a case of simultaneously receiving a reception signal in the first band and a reception signal in the second band, the first common terminal and the first terminal are connected, the first common terminal and the second terminal are connected, the first common terminal and the third terminal are disconnected, and the fourth terminal and the fifth terminal are disconnected.

<4>

The radio-frequency circuit according to any of <1> to <3>, wherein, in a case of simultaneously receiving a reception signal in the first band, a reception signal in the second band, and a reception signal in the third band, the first common terminal and the first terminal are connected, the first common terminal and the second terminal are connected, the first common terminal and the third terminal are disconnected, and the fourth terminal and the fifth terminal are connected.

<5>

The radio-frequency circuit according to any of <1> to <4>, wherein, in a case of receiving only a reception signal in the third band among the first band, the second band, and the third band, the first common terminal and the third terminal are connected, the first common terminal and the first terminal are disconnected, the first common terminal and the second terminal are disconnected, and the fourth terminal and the fifth terminal are disconnected.

<6>

The radio-frequency circuit according to <1>, further including:

a second capacitor arranged in series in the first signal path between the first terminal and the first filter;

a second inductor connected between the first signal path between the second capacitor and the first filter and ground; and a third switch circuit having a sixth terminal and a seventh terminal, the sixth terminal connected to the first signal path between the second capacitor and the first filter, and the seventh terminal connected to the third signal path.

<7>

The radio-frequency circuit according to <6>, wherein:

the first switch circuit can switch between a connection and disconnection between the first common terminal and the first terminal, can switch between a connection and disconnection between the first common terminal and the second terminal, and can switch between a connection and disconnection between the first common terminal and the third terminal;

the second switch circuit can switch between a connection and disconnection between the fourth terminal and the fifth terminal;

the third switch circuit can switch between a connection and disconnection between the sixth terminal and the seventh terminal;

in a case of simultaneously receiving a third reception signal in the third band and a second reception signal in the second band, the first common terminal and the second terminal are connected, the first common terminal and the third terminal are disconnected, and the fourth terminal and the fifth terminal are connected; and in a case of simultaneously receiving the third reception signal in the third band and a first reception signal in the first band, the first common terminal and the first terminal are connected, the first common terminal and the third terminal are disconnected, and the sixth terminal and the seventh terminal are connected.

<8>

The radio-frequency circuit according to any one of <1> to <5>, wherein:

the first terminal and the third terminal are a same terminal; and the radio-frequency circuit further includes a fourth switch circuit arranged in the third signal path between the third terminal and the fifth terminal, and switching between a connection and disconnection between the third terminal and the fifth terminal, and a fifth switch circuit arranged in the first signal path between the first terminal and the first filter, and switching between a connection and disconnection between the first terminal and the first filter.

<9>

The radio-frequency circuit according to any of <1> to <8>, wherein:

the first switch circuit further includes a second common terminal;

the radio-frequency circuit further includes a first antenna connection terminal and a second antenna connection terminal;

the first common terminal is connected to the first antenna connection terminal;

the second common terminal is connected to the second antenna connection terminal; and the first switch circuit can switch a connection between the first common terminal and any one of the first terminal, the second terminal, and the third terminal, and can switch a connection between the second common terminal and any one of the first terminal, the second terminal, and the third terminal.

<10>

The radio-frequency circuit according to any of <1> to <9>, wherein:

the first band is band B7, B39, B40, or B41 for LTE, or band n7, n39, n40, or n41 for 5G-NR;

the second band is band B1 or B3 for LTE, or band n1 or n3 for 5G-NR; and the third band is band B32, B75, or B76 for LTE, or band n32, n75, or n76 for 5G-NR.

The present disclosure can be widely used in communication equipment such as mobile phones, as a radio-frequency (RF) circuit arranged in the front-end portion.

What is claimed is:

1. A radio-frequency circuit comprising:

a first switch circuit having a first common terminal, a first terminal, a second terminal, and a third terminal;

a first signal path connected to the first terminal;

a first filter connected in the first signal path and having a passband comprising a reception band of a first band;

a second signal path connected to the second terminal;

a second filter connected in the second signal path and having a passband comprising a reception band of a second band;

a third signal path connected to the third terminal, and configured to pass a reception signal in a third band simultaneously with the first band and the second band;

a first capacitor connected in series in the second signal path between the second terminal and the second filter;

a first inductor connected between a node on the second signal path and ground, the node on the second signal path being between the first capacitor and the second filter; and a second switch circuit having a fourth terminal and a fifth terminal, the fourth terminal being connected to the second signal path between the first capacitor and the second filter, and the fifth terminal being connected to the third signal path.

2. The radio-frequency circuit according to claim 1, wherein the first switch circuit is configured to:

selectively connect and disconnect the first common terminal to the first terminal, selectively connect and disconnect the first common terminal to the second terminal, and selectively connect and disconnect the first common terminal to the third terminal;

wherein the second switch circuit is configured to selectively connect and disconnect the fourth terminal to the fifth terminal;

wherein in a case of simultaneously receiving the reception signal in the third band and a reception signal in the second band, the first common terminal and the second terminal are connected, the first common terminal and the third terminal are disconnected, and the fourth terminal and the fifth terminal are connected; and wherein in a case of simultaneously receiving the reception signal in the third band and a reception signal in the first band, the first common terminal and the first terminal are connected, the first common terminal and the third terminal are connected, the first common terminal and the second terminal are disconnected, and the fourth terminal and the fifth terminal are disconnected.

3. The radio-frequency circuit according to claim 2, wherein in a case of simultaneously receiving the reception signal in the first band and the reception signal in the second band, the first common terminal and the first terminal are connected, the first common terminal and the second terminal are connected, the first common terminal and the third terminal are disconnected, and the fourth terminal and the fifth terminal are disconnected.

4. The radio-frequency circuit according to claim 2, wherein in a case of simultaneously receiving the reception signal in the first band, the reception signal in the second band, and the reception signal in the third band, the first common terminal and the first terminal are connected, the first common terminal and the second terminal are connected, the first common terminal and the third terminal are disconnected, and the fourth terminal and the fifth terminal are connected.

5. The radio-frequency circuit according to claim 2, wherein in a case of receiving only the reception signal in the third band among the reception signals of the first band, the second band, and the third band, the first common terminal and the third terminal are connected, the first common terminal and the first terminal are disconnected, the first common terminal and the second terminal are disconnected, and the fourth terminal and the fifth terminal are disconnected.

6. The radio-frequency circuit according to claim 1, further comprising:

a second capacitor connected in series in the first signal path between the first terminal and the first filter;

a second inductor connected between a node on the first signal path and ground, the node on the first signal path being between the second capacitor and the first filter; and a third switch circuit having a sixth terminal and a seventh terminal, the sixth terminal being connected to the first signal path between the second capacitor and the first filter, and the seventh terminal being connected to the third signal path.

7. The radio-frequency circuit according to claim 6, wherein the first switch circuit is configured to:

selectively connect and disconnect the first common terminal to the first terminal, selectively connect and disconnect the first common terminal to the second terminal, and selectively connect and disconnect the first common terminal to the third terminal;

wherein the second switch circuit is configured to selectively connect and disconnect the fourth terminal and to fifth terminal;

wherein the third switch circuit is configured to selectively connect and disconnect the sixth terminal and to seventh terminal;

wherein in a case of simultaneously receiving the reception signal in the third band and a reception signal in the second band, the first common terminal and the second terminal are connected, the first common terminal and the third terminal are disconnected, and the fourth terminal and the fifth terminal are connected; and wherein in a case of simultaneously receiving the reception signal in the third band and a reception signal in the first band, the first common terminal and the first terminal are connected, the first common terminal and the third terminal are disconnected, and the sixth terminal and the seventh terminal are connected.

8. The radio-frequency circuit according to claim 1, wherein the first terminal and the third terminal are a same terminal; and wherein the radio-frequency circuit further comprises:

a fourth switch circuit connected in the third signal path between the third terminal and the fifth terminal, and configured to selectively connect and disconnect the third terminal to the fifth terminal, and a fifth switch circuit connected in the first signal path between the first terminal and the first filter, and configured to selectively connect and disconnect the first terminal to the first filter.

9. The radio-frequency circuit according to claim 1, wherein the first switch circuit further comprises a second common terminal;

wherein the radio-frequency circuit further comprises a first antenna connection terminal and a second antenna connection terminal;

wherein the first common terminal is connected to the first antenna connection terminal;

wherein the second common terminal is connected to the second antenna connection terminal; and wherein the first switch circuit is configured to:

selectively connect and disconnect the first common terminal to any one of the first terminal, the second terminal, and the third terminal, and selectively connect and disconnect the second common terminal to any one of the first terminal, the second terminal, and the third terminal.

10. The radio-frequency circuit according to claim 1, wherein:

the first band is band B7, B39, B40, or B41 for Long Term Evolution (LTE), or band n7, n39, n40, or n41 for Fifth Generation New Radio (5G-NR);

the second band is band B1 or B3 for LTE, or band n1 or n3 for 5G-NR; and the third band is band B32, B75, or B76 for LTE, or band n32, n75, or n76 for 5G-NR.

* * * * *